United States Patent [19]
Yamagami et al.

[11] Patent Number: 6,076,481
[45] Date of Patent: Jun. 20, 2000

[54] PLASMA PROCESSING APPARATUS AND PLASMA PROCESSING METHOD

[75] Inventors: Atsushi Yamagami, Kawasaki; Satoshi Takaki, Komae, both of Japan

[73] Assignee: Canon Kabushiki Kaisha, Tokyo, Japan

[21] Appl. No.: 08/825,594

[22] Filed: Apr. 1, 1997

[30] Foreign Application Priority Data

Apr. 3, 1996 [JP] Japan .................................. 8-081506
Apr. 10, 1996 [JP] Japan .................................. 8-113272

[51] Int. Cl.$^7$ .............................. C23C 16/00; H01L 21/00
[52] U.S. Cl. ...................... 118/723 E; 156/345; 438/729; 216/67; 216/71; 427/569
[58] Field of Search .................... 118/723 E, 723 ER, 118/723 I, 723 IR, 723 AN; 156/345; 438/729; 216/67, 68, 71; 427/569

[56] References Cited

U.S. PATENT DOCUMENTS

| | | | |
|---|---|---|---|
| 4,633,811 | 1/1987 | Maniyama .............................. | 118/723 |
| 5,069,928 | 12/1991 | Echizen et al. ......................... | 427/45.1 |
| 5,292,396 | 3/1994 | Takashima et al. ..................... | 156/345 |
| 5,512,510 | 4/1996 | Maruyama et al. .................... | 437/101 |
| 5,534,070 | 7/1996 | Okamura et al. ................... | 118/723 E |

FOREIGN PATENT DOCUMENTS 154160 9/1986 European Pat. Off. .

OTHER PUBLICATIONS

Curtins et al., "Influence of Plasma Excitation Frequency for α–Si:H Thin Film Deposition", Plasma Chemistry and Plasma Processing, vol. 7, No. 3, 1987, pp. 267–273.

*Primary Examiner*—Richard Bueker
*Assistant Examiner*—Luz Alejandro
*Attorney, Agent, or Firm*—Fitzpatrick, Cella, Harper & Scinto

[57] ABSTRACT

One or more mismatching portions in which a characteristic impedance of a high frequency transmission cable of a cathode electrode is changed in a traveling direction of an incident wave of the high frequency are provided on the cathode electrode for use in plasma processing, whereby the plasma processing can form a high-quality deposited film having an extremely uniform film thickness and a homogeneous film quality on a substrate at high speed, can effectively form a semiconductor device, can also form the high-quality deposited film having the extremely uniform film thickness and the homogeneous film quality in the axial direction and the circumferential direction of the cylindrical substrate on the surfaces of a plurality of cylindrical substrates at high speed, and can effectively form the semiconductor device.

45 Claims, 14 Drawing Sheets

PLASMA PROCESSING APPARATUS AND PLASMA PROCESSING METHOD

BACKGROUND OF THE INVENTION

1. Field of the Invention

The present invention relates to a plasma processing apparatus including a plasma CVD apparatus, a plasma etching apparatus and a plasma ashing apparatus used for manufacturing a semiconductor device, a photosensitive member device for an electrophotography, a line sensor for inputting an image, a flat panel display, an image pickup device, a photovoltaic power device, etc., and to a plasma processing method which can be carried out by using the apparatuses.

2. Related Background Art

Recently, in a process of manufacturing the semiconductor device, etc., the plasma CVD apparatus is industrially practiced. More specifically, since the plasma processing apparatus including the plasma CVD apparatus using a high frequency of 13.56 MHz and a microwave of 2.45 GHz can process regardless of a substrate material, a deposited film material, etc. being a conductive material or an insulating material, the plasma processing apparatus is generally used.

As an example of such a plasma CVD apparatus, a parallel plane plate type apparatus using a high frequency energy will be explained with reference to FIG. 1.

A cathode electrode 3 is arranged in a reaction vessel 1 via a cathode electrode support plate 2.

An earth shield 4 is arranged around the cathode electrode 3 so that a discharge may not be generated between a side portion of the cathode electrode 3 and the reaction vessel 1.

The cathode electrode 3 is connected to a high frequency power 10 via a matching circuit 9 and a high frequency power supply line. A plane plate-shaped substrate 6, on which a film is formed, for carrying out plasma CVD is arranged at a counter electrode 5 arranged parallel to the cathode electrode 3. The substrate 6 is kept at a desired temperature by substrate temperature control means (not shown).

In case of using this apparatus, the plasma CVD is carried out as follows.

After the reaction vessel 1 is evacuated by a vacuum evacuating means 7 until the reaction vessel 1 is highly vacuum, a reactive gas is introduced into the reaction vessel 1 by gas supply means 8, and a predetermined pressure is held.

A high frequency power is supplied to the cathode electrode 3 from the high frequency power 11, and a plasma is generated between the cathode electrode and the counter electrode.

Thereby, the reactive gas is decomposed and excited to form a deposited film on the substrate 6.

In general, an RF energy of 13.56 MHz is used as the high frequency energy. When a discharge frequency is 13.56 MHz, there is such an advantage that a discharge condition can be relatively easily controlled and a film quality of an obtained film is excellent. However, there is such a problem that a usage efficiency of the gas is low and a formation rate of the deposited film is relatively small.

In view of such a problem, a plasma CVD method using the high frequency having about 25 to 150 MHz has been studied.

For example, "Plasma Chemistry and Plasma Processing, Vol. 7, No. 3, p.267 to 273, (1987)" (hereinafter, referred to as "Reference 1") discloses a parallel plane plate type glow discharge decomposition apparatus is used, and a starting gas (silane gas) is decomposed with the high frequency energy having a frequency of 25 MHz to 150 MHz so that an amorphous silicon (hereinafter, a-Si) film is formed.

Concretely, the Reference 1 discloses that while the frequency is changed within a range of 25 MHz to 150 MHz, the a-Si film is formed; that when 70 MHz is used, a film deposition rate becomes maximum, that is, 2.1 nm/sec; that this maximum rate is from about five times to eight times larger than the rate in case of the plasma CVD method using 13.56 MHz; and that the defect density, the optical bandgap and the electroconductivity of the obtained a-Si film are less influenced by an excited frequency.

However, a film formation described in the Reference 1 is a laboratory scale. When a film having a large area is formed, whether or not such an effect can be obtained is not described at all in the Reference 1.

Furthermore, the Reference 1 does not suggest as to whether or not a film is simultaneously formed on a plurality of substrates and a semiconductor device having a large area which can be practical is effectively formed. The Reference 1 merely suggests such a possibility that the use of the high frequency (13.56 MHz to 200 MHz) has an interesting view of a high-speed processing of an a-Si:H thin film device having a large area at a low cost which is required for a thickness of several $\mu$m.

The above conventional example is the example of the plasma CVD apparatus which is appropriate for processing a plane plate-shaped substrate. An example of the plasma CVD apparatus which is appropriate for forming a deposited film on a plurality of cylindrical substrates is disclosed in EP154160A (hereinafter, referred to as "Reference 2").

The Reference 2 discloses the plasma CVD apparatus using a microwave energy source having the frequency of 2.45 GHz and the plasma CVD apparatus using a radio frequency energy (RF energy) source.

In the plasma CVD apparatus using the microwave disclosed in the Reference 2, since the microwave energy is used, a plasma density is extremely high when the film is formed. Therefore, the starting gas is rapidly is decomposed, thereby carrying out film deposition at high speed.

Accordingly, there is such a problem that it is very difficult to stably carry out formation of a deposited dense film.

Next, an example of an RF plasma CVD apparatus of a type described in the Reference 2 will be explained with reference to the accompanying drawings.

The plasma CVD apparatus shown in FIGS. 2 and 3 is a plasma CVD apparatus based on the RF plasma CVD apparatus described in the Reference 2.

FIG. 3 shows a cross-sectional view taken in the line 3—3 of FIG. 2. FIGS. 2 and 3 show a reaction vessel 100.

Six substrate holders 105A are concentrically arranged at a predetermined distance in the reaction vessel 100. Numeral 106 denotes a cylindrical substrate for film formation arranged on each substrate holder 105A.

A heater 140 is arranged in an inner portion of each substrate holder 105A so that the cylindrical substrate 106 may be heated from an inner side.

Furthermore, each substrate holder 105A is connected to a shaft 131 coupled to a motor 132 so that the substrate holder 105A may be rotated.

Numeral 105B denotes an auxiliary holding member of the cylindrical substrate 106. Numeral 103 denotes a cathode electrode for introducing a high frequency power located at the center portion of a plasma generating region.

The cathode electrode 103 is connected to a high frequency power source 111 via a matching circuit 109.

Numeral 130 denotes a cathode electrode support member. Numeral 107 denotes an evacuation pipe provided with an evacuation valve. The evacuation pipe is communicated with an evacuation mechanism 135 provided with a vacuum pump. Numeral 108 denotes a starting gas supply system comprising a gas cylinder, a mass flow controller, a valve and the like.

The starting gas supply system 108 is connected to a gas discharge pipe 116 provided with a plurality of gas discharge ports via a gas supply pipe 117. Numeral 133 denotes a seal member.

In case of using this apparatus, the plasma CVD is carried out as follows.

After the reaction vessel 100 is evacuated by the evacuation mechanism 135 until the reaction vessel 100 becomes highly vacuum, a starting gas is introduced into the reaction vessel 100 from the gas supply means 108 via the gas supply pipe 117 and the gas discharge pipe 116, and a predetermined pressure is held.

Next, a high frequency power is supplied to the cathode electrode 103 from the high frequency power source 111 via the matching circuit 109 to generate plasma between the cathode electrode and the cylindrical substrate 106.

Thereby, the starting gas is decomposed and excited by the plasma, and the deposited film is formed on the cylindrical substrate 106.

When the plasma CVD apparatus shown in FIGS. 2 and 3 is used, since a discharge space is surrounded by the cylindrical substrate 106, there is such an advantage that the starting gas can be used at a high utilization efficiency.

By the way, when the deposited film is formed on the entire surface of the cylindrical substrate by using the plasma CVD apparatus shown in FIGS. 2 and 3, it is necessary to rotate the cylindrical substrate. By rotating the cylindrical substrate, a substantial deposition rate is reduced to about ⅓ to ⅕ of the case of using the parallel plane plate type plasma CVD apparatus described above.

That is, since the discharge space is surrounded by the cylindrical substrates, the deposited film is formed at the same deposition rate as the parallel plane plate type plasma CVD apparatus at a position where the cylindrical substrate is just faced to the cathode electrode. However, the deposited film is scarcely formed at the position which is not contacted to the discharge space.

A concrete frequency of the RF energy is not described in the Reference 2.

The plasma CVD apparatus shown in FIGS. 2 and 3 is used, 13.56 MHz which is generally used as the RF energy is used, and $SiH_4$ is used as the starting gas. Under the pressure condition of several 100 mTorr that a powder such as polysilane, etc. is easily generated, although the deposition rate is high, while the cylindrical substrate is rotated, an amorphous silicon film is deposited on the entire surface of the substrate. In this case, a substantial deposition rate is at most 0.5 nm/s.

When the plasma CVD apparatus shown in FIGS. 2 and 3 is used so that an electrophotographic photosensitive member comprising an amorphous silicon film as a photosensitive layer is manufactured, the thickness of an amorphous silicon photosensitive layer needs about 30 μm. Accordingly, it takes more than sixteen hours to deposit the film at the deposition rate of about 0.5 nm/s described above. Therefore, a productivity is not sufficient.

Furthermore, according to the apparatus shown in FIGS. 2 and 3, when the frequency of the RF energy is 30 MHz or more, a nonuniform plasma is easily formed relative to the axial direction of the cylindrical substrate. There is such a problem that it is extremely difficult to form a uniform deposited film on the cylindrical substrate.

SUMMARY OF THE INVENTION

It is an object of the present invention to provide a plasma processing apparatus and a plasma processing method which can solve the above problems, can form a high-quality deposited film having a remarkably uniform film thickness and an uniform film quality on a substrate having a large area at a high speed, can uniformly carry out etching at a high speed or ashing at a high speed, and can effectively form or process a semiconductor device.

Furthermore, it is another object of the present invention to provide a plasma processing apparatus such as a plasma CVD apparatus and a plasma processing method such as a method of forming a deposited film by using plasma CVD which can form at a high speed a high-quality deposited film, for example, having a remarkably uniform film thickness and an uniform film quality with respect to any direction of the axial direction and the circumferential direction of a cylindrical substrate on the surface of, for example, a plurality of cylindrical substrates.

It is still another object of the present invention to provide a plasma processing apparatus comprising a reaction vessel having a space whose pressure can be reduced, substrate holding means and a cathode electrode arranged in the reaction vessel, in which a high frequency power is supplied to the cathode electrode to generate plasma between a substrate held by the substrate holding means and the cathode electrode to carry out plasma processing of the substrate, wherein the cathode electrode is provided on at least one mismatching portion in which the characteristic impedance of a high frequency transmission line is changed in a traveling direction of an incident wave of the high frequency.

It is a further object of the present invention to provide a plasma processing method which comprises introducing a gas into a reaction vessel having a space whose pressure can be reduced, applying a high frequency power to a cathode electrode in the reaction vessel, generating plasma by a high frequency discharge, carrying out plasma processing of a substrate held by substrate holding means, wherein the high frequency power is supplied to the cathode electrode having a mismatching portion in which the characteristic impedance of the high frequency transmission line of the cathode electrode is changed in the traveling direction of the incident wave of the high frequency, thereby generating plasma.

It is a still further object of the present invention to provide a cathode electrode comprising a central conductive member and a dielectric member covering the central conductive member, and having a mismatching portion in which an impedance with respect to the high frequency inputted from the one end side of the central conductive member is changed.

DETAILED DESCRIPTION OF THE PREFERRED EMBODIMENTS

According to the present invention, a high-quality deposited film having an extremely uniform film thickness and a uniform film quality can be formed on a substrate having a large area at high speed, or a uniform etching and ashing can be carried out. This is based on finding obtained by the results of the following experiments by the present inventors.

Experiment 1

An experiment was carried out according to an RF plasma CVD technique using an RF energy source of a type described in the Reference 2.

Figure 2:
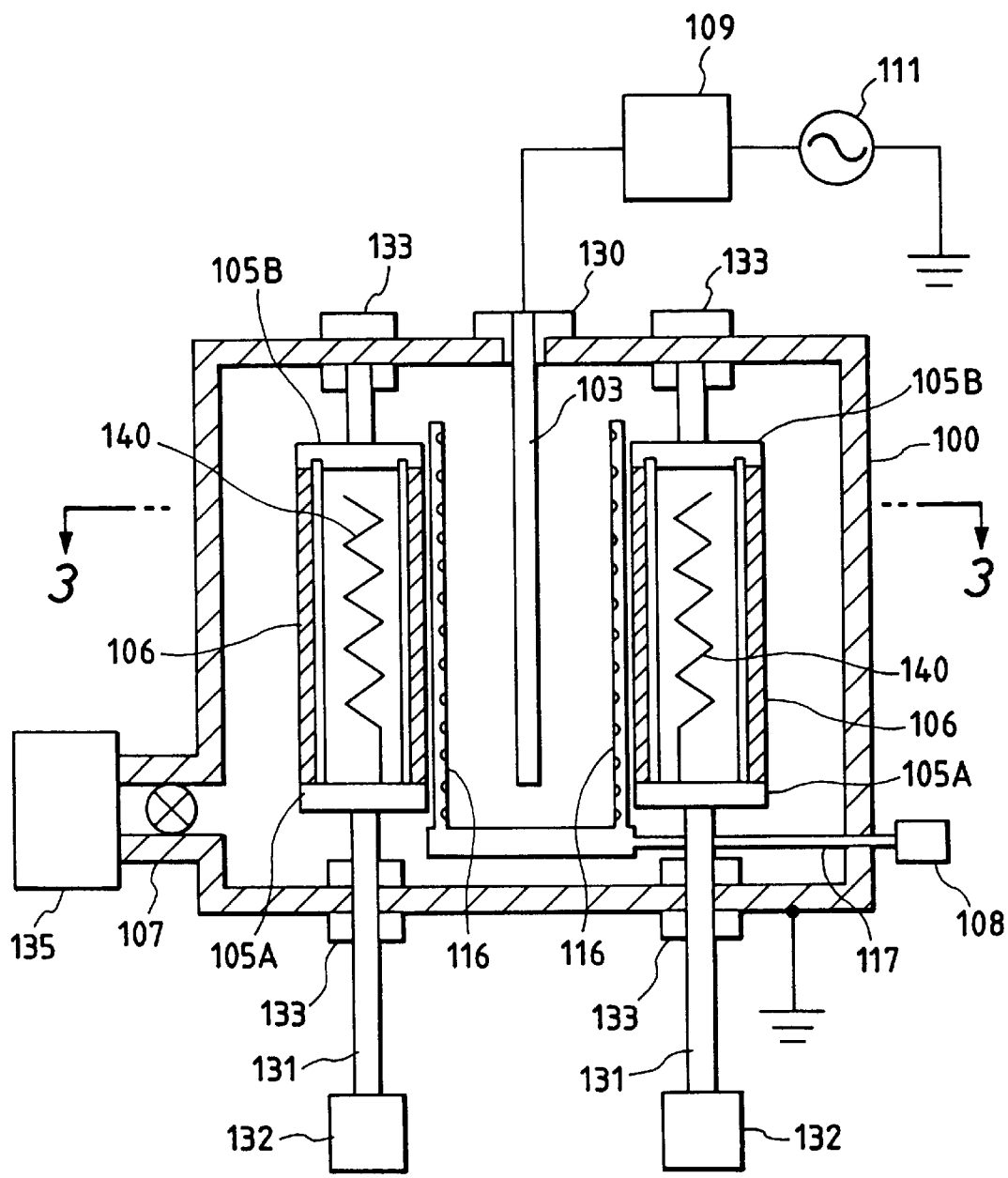
Figure 3:
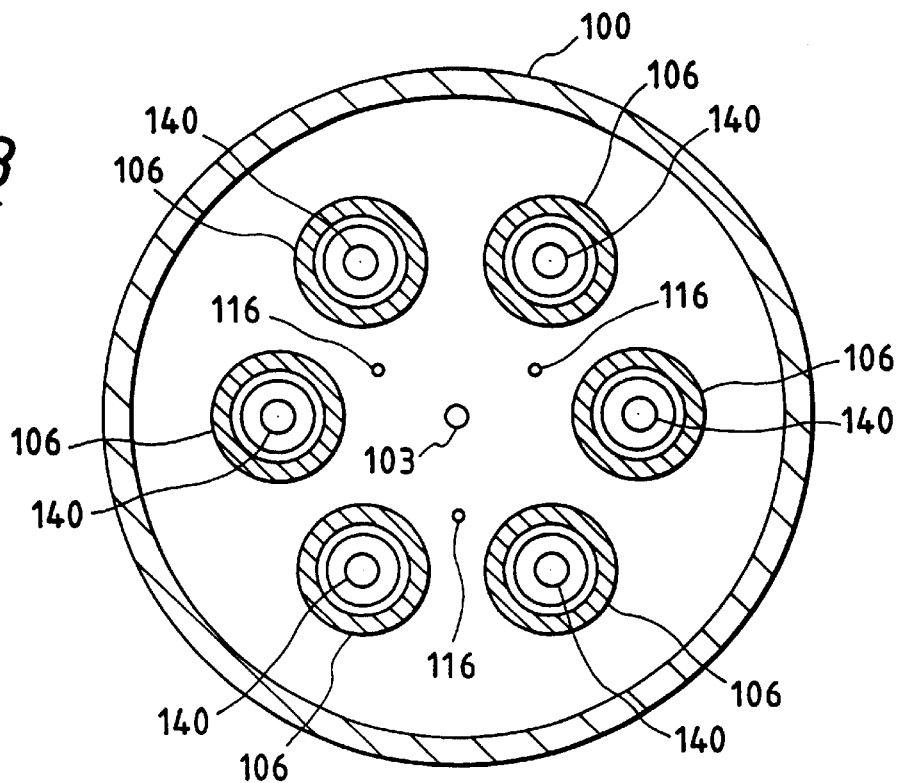

That is, in a plasma CVD apparatus shown in FIGS. 2 and 3, a high frequency power source having various frequencies was used, and an amorphous silicon film was formed on all the peripheral surfaces of cylindrical substrates.

When respective amorphous silicon films were formed, an influence upon a film quality of a deposited film, a distribution of the film quality, a deposition rate and the distribution of the deposition rate occurred by the frequency of the high frequency power source was observed.

In the first place, although the experiment was carried out on a pressure condition of about 0.2 Torr as disclosed in the Reference 1, since a powder such as polysilane, etc. was considerably generated, the experiment was carried out on a condition that a pressure was 50 mTorr or less according to the following procedure.

In this experiment, six cylindrical substrates made of Al (aluminum) having a diameter of 108 mm, a length of 358 mm and a thickness of 5 mm were arranged in the reaction vessel 100, per film formation. While the substrates were rotated, a film formation experiment was carried out.

A cylindrical cathode electrode made of Al having the diameter of 30 mm and the length of 450 mm was used as the cathode electrode 103.

In order to evaluate the film quality, a coning #7059 glass substrate on which a comb-like electrode made of Cr having a gap of 250 $\mu$m is evaporated for estimating an electrical characteristic was used as a substrate for electrical characteristic evaluation. The glass substrate was arranged over the length of 358 mm in an axial direction of the surface of one cylindrical substrate among six cylindrical substrates. An experiment: for film quality evaluation was carried out according to the following procedure.

In the first place, the evacuation mechanism 135 was actuated, and the inner part of the reaction vessel 100 was evacuated to adjust the internal pressure of the reaction vessel 100 to $1 \times 10^{-6}$ Torr.

Next, electric current was passed through the heater 140 to heat and keep respective cylindrical substrates 106 at a temperature of 250° C.

Next, film formation was carried out according to the following procedure.

That is, an $SiH_4$ gas was introduced into the reaction vessel 100 at a flow rate of 500 scam from the starting gas supply means 108 via the gas supply pipe 117 and the gas discharge pipe 116. The internal pressure of the reaction vessel 100 was adjusted to three pressure conditions, that is, 50 mTorr, 25 mTorr and 5 mTorr.

Under each pressure condition, 1 KW high frequency having a frequency ranging from 13.56 MHz to 650 MHz was generated from the high frequency power source 111. The high frequency was supplied to the cathode electrode 103 via the matching circuit 109.

Here, a high frequency power source which can supply a frequency of the above range was used as the high frequency power source 111.

The matching circuit 109 was appropriately adjusted corresponding to the frequency of the high frequency power source. In such a manner, an amorphous silicon film was formed on the cylindrical substrate 106 and on the above substrate for electrical characteristic evaluation.

The film quality and the distribution of the film quality were evaluated by measuring a photosensitivity ((a photoconductivity $\sigma p$)/(a dark conductivity $\sigma d$)) at eighteen positions spaced by every about 20 mm over the range of from the upper end to the lower end of the substrate for electrical characteristic evaluation. Here, the optical conductivity $\sigma p$ was evaluated as the conductivity at the time of irradiating with an He-Ne laser having a strength of 1 mw/cm² (wavelength is 632.8 nm). By the finding in forming the electrophotographic photosensitive member by the present inventors, the condition is optimized on the basis of such conditions that the deposited film of quality having the photosensitivity of $10^3$ or more can be obtained according to the above method. In the electrophotographic photosensitive member formed according to the optimized conditions, an practice-worthy image can be obtained.

However, recently, since an image is highly contrasted, the photosensitivity of $10^4$ or more is essential. Furthermore, it is expected that the photosensitivity of more than $10^5$ or $10^6$ is required in the near future.

From such a viewpoint, in this experiment, a value of the photosensitivity was evaluated as follows.

AA: The photosensitivity is $10^5$ or more, and the film characteristic is excellent.

A: The photosensitivity is $10^4$ or more, and the film characteristic is good.

B: The photosensitivity is $10^3$ or more, and the film characteristic is no problem in a practical use.

C: The photosensitivity is less than $10^3$, and the film characteristic is in some cases, not appropriate for a practical use.

The deposition rate and the distribution of the deposition rate were evaluated as follows. An eddy-current type film thickness meter (manufactured by Kett scientific laboratory) was used, and the thickness of the formed film was measured at eighteen positions spaced by every about 20 mm, similarly to the measurement positions of the photosensitivity described above, in the axial direction of one cylindrical substrate among five cylindrical substrates on which the a-Si film was formed.

The deposition rate was calculated on the basis of the film thickness at the eighteen positions, and an average value of the obtained values was defined as the average deposition rate.

The evaluation as to the distribution of the deposition rate was carried out as follows.

That is, relating to the distribution of the deposition rate in the axial direction, a difference between a minimum value and a maximum value of the deposition rate at the eighteen positions in the axial direction was determined. The difference was divided by the average deposition rate, that is, the distribution of the deposition rate was determined by {(the maximum value—the minimum value)/the average value}. The obtained value was represented by a percentage as the distribution of the deposition rate in the axial direction.

The evaluated results of the photosensitivity of samples formed under the three conditions, 50 mTorr, 25 mTorr and 5 mTorr are shown in Tables 1, 2 and 3, respectively. The evaluated results of the deposition rate of samples formed under the three conditions are shown in Tables 4, 5 and 6, respectively.

Relating to the samples formed by the high frequency energy having the frequency of 13.56 MHz, the film quality and the deposition rate of the film formed under the pressure condition of 50 mTorr are relatively uniform. However, the average deposition rate is 0.15 nm/s, and it is very slow. Under the pressure condition of 25 mTorr or less, discharge could not be generated.

Relating to the samples formed by the high frequency energy having the frequency of 30 MHz, the photosensitivity of the film formed under the pressure condition of 50 mTorr and 25 mTorr was reduced at the upper position of the cylindrical substrate. Although the average deposition rate was increased about three times more than that of the film formed by the frequency of 13.56 MHz, the distribution of the deposition rate was deteriorated.

Furthermore, under the pressure condition of 5 mTorr, the discharge could not be generated.

Relating to the samples formed by the high frequency energy having the frequency of 60 MHz to 300 MHz, the photosensitivity was reduced from a center upper position to a center lower position of the cylindrical substrate. The photosensitivity tended to increase at the position where the photosensitivity was not reduced, accompanied by the reduction of the pressure. Although the average deposition rate was about seven times to twelve times more than that of the film formed by the frequency of 13.56 MHz, the distribution of the deposition rate was deteriorated.

Relating to the samples formed by the high frequency energy having the frequency of 400 MHz to 600 MHz, the photosensitivity was reduced at a plurality of positions of the cylindrical substrate. The photosensitivity tended to increase at the position where the photosensitivity was not reduced, accompanied by the reduction of the pressure.

Although the average deposition rate was about four times to six times more than that of the film formed by the frequency of 13.56 MHz, the distribution of the deposition rate was deteriorated.

Under the discharge condition of 650 MHz, discharge was intermittent under all the pressure conditions, and the sample of the film formation to be evaluated could not be formed.

As the results of the above experiment, the following was revealed. When the frequency of the RF energy is 30 MHz or more, discharge can be generated in a high vacuum region where a vapor phase reaction is hard to occur, and very excellent film characteristics can be obtained. Furthermore, the deposition rate is also increased, compared to the film formed by the frequency of 13.56 MHz. However, the distribution of the film quality and the distribution of the deposition rate are deteriorated.

The present inventors keenly have studied in order to solve a cause that the film quality is ubiquitously deteriorated when the frequency of the RF energy is 30 MHz or more.

As a result, it was revealed that the distribution of a plasma potential is strongly correlated with an ubiquitous deterioration of the film quality. That is, when the plasma potential was measured in the axial direction of the cylindrical substrate by using a Langmuir's probe method, the plasma potential was reduced at the portion corresponding to the position where the film quality was ubiquitously deteriorated.

As a result, it was presumed that the distribution of the film quality and the distribution of the deposition rate were occurred due to a standing wave generated on the cathode electrode.

In general, when plasma is generated by applying the high frequency power between the cathode electrode and the counter electrode, in some cases, the standing wave which is not negligible is generated depending on a relationship between the frequency of the high frequency power applied to the electrode and a size of the electrode.

That is, when the frequency of the high frequency power is high or when the cathode electrode has a large area, the standing wave easily generates. When the standing wave is large, the distribution of electric field becomes worse in the cathode electrode. Accordingly, the plasma distributions of a plasma density, a plasma potential, an electronic temperature and the like between the electrodes are disordered, thereby giving a bad influence to the quality of the film formed by the plasma CVD.

In the experiment described above, it is considered that a reflected wave is generated on the cathode electrode at the tip portion of the cathode electrode and is interfered with the incident wave, thereby, in case of the frequency of 30 MHz or more, generating the standing wave having the influence upon the film quality and the deposition rate.

More specifically, it is considered that the electric field becomes weaker at a node position of the standing wave, and the ubiquitous reduction of the plasma potential is caused, whereby the film quality is ubiquitously deteriorated.

Furthermore, in case of the frequency of 400 MHz to 600 MHz, the nodes of the standing wave are generated at a plurality of positions.

On the basis of the above experimental results and consideration, the present inventors have studied a shape and a structure of the cathode electrode in order to prevent the deterioration of the film quality and the distribution of the film thickness which is easy to occur when the frequency of the RF energy becomes higher.

As a result, it was revealed that it is advantageous for this purpose to arrange a reflecting surface for the high frequency which generates the reflected wave for reinforcing the incident wave and the electric field, near the position considered as the node of the standing wave.

For example, it is revealed that it is advantageous to cover a rod-shaped cathode electrode with a dielectric cover having an nonuniform thickness over the axial direction of the cathode electrode.

Figure 4:
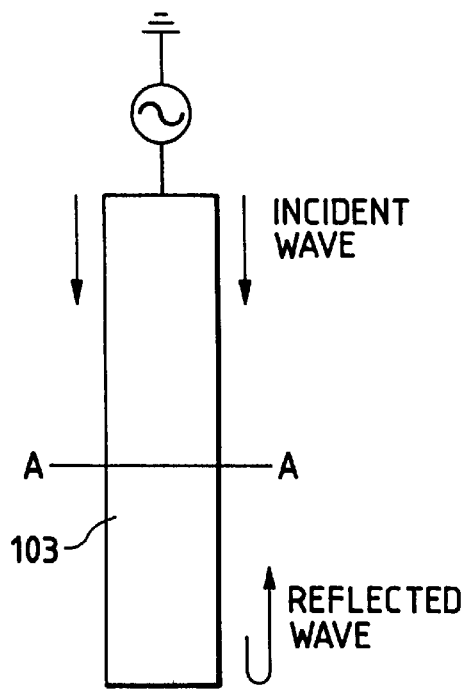
FIGS. 4, 5, 6 and 7 are schematic cross-sectional views showing an example of a cathode electrode, respectively.
Figure 5:
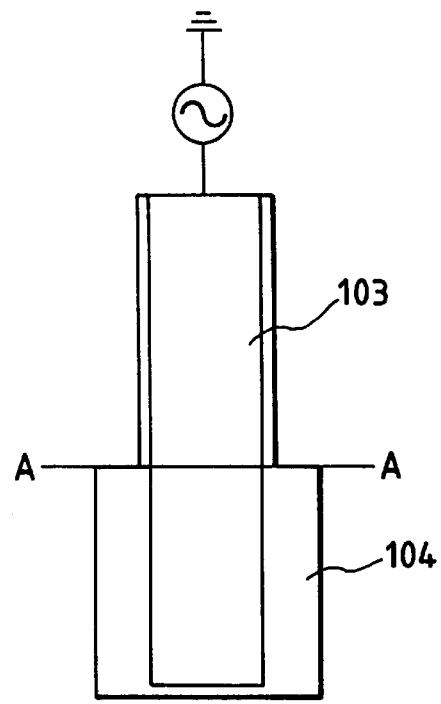

For example, when it is considered to generate the node of the standing wave at the position A—A of the columnar cathode electrode 103 in FIG. 4, a dielectric cover 104 such as alumina ceramics with a level difference having a thick portion from the position A—A to the tip of the cathode electrode 103 may be arranged as shown in FIG. 5.

That is, in such a manner, the characteristic impedance of the high frequency transmission line is rapidly changed at the position A—A, and the position A—A becomes the mismatching portion of the high frequency transmission line. Accordingly, one part of the incident wave is reflected at the position A—A.

Furthermore, according to the structure of the cathode electrode shown in FIG. 5, it is considered that the characteristic impedance of the line is changed from a small impedance to a large impedance toward the traveling direction of the incident wave of the high frequency. Accordingly, the incident wave is reflected at the position A—A to reinforce the electric field.

Figure 6:
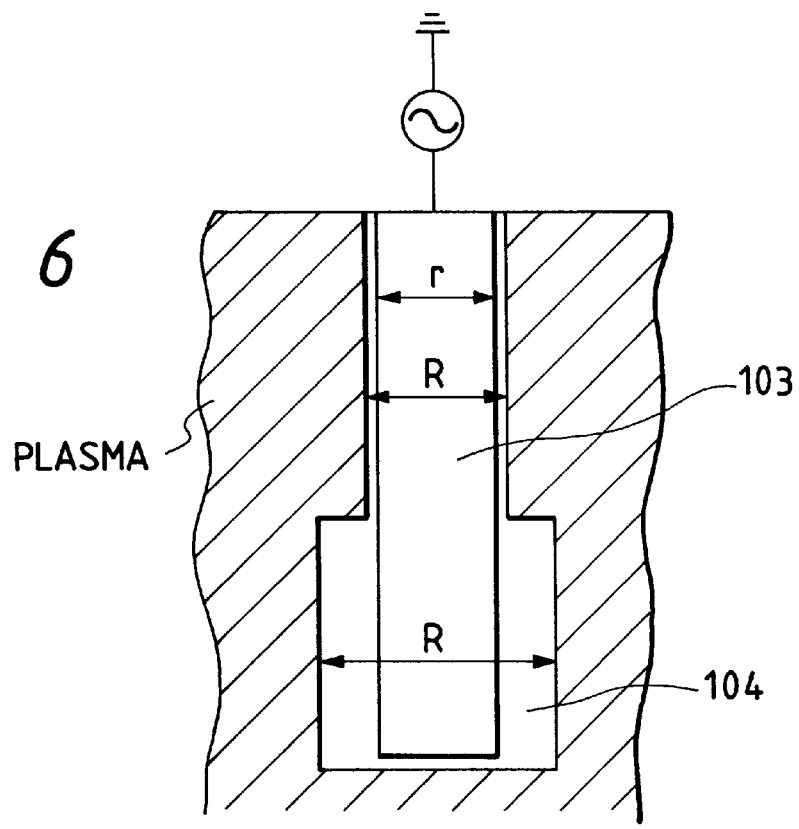

That is, as shown in FIG. 6, the transmission line of high frequency of the cathode electrode can be regarded as a coaxial line in which the cathode electrode 103 is an inner conductor and the plasma is an outer conductor. When an outer diameter of the inner conductor of the coaxial line is defined as r and an inner diameter of the outer conductor is defined as R, the characteristic impedance is proportional to log(R/r). Accordingly, since R is changed from a small value to a large value toward the traveling direction of the incident wave, the characteristic impedance is changed from the small value to the large value.

Figure 7:
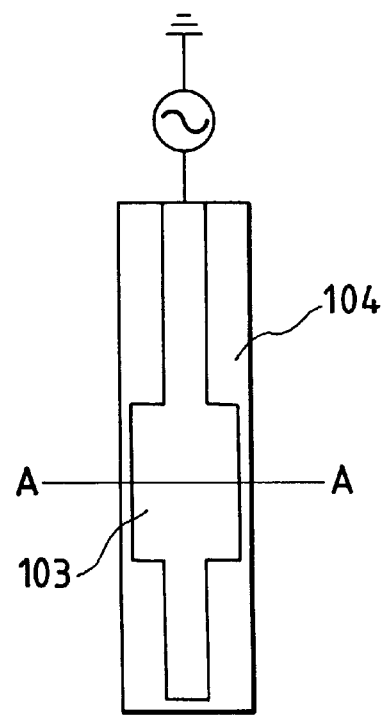

Furthermore, advancing this thought, when the distribution of electric field is nonuniform on the cathode electrode, a dielectric cover having a large thickness covers the cathode electrode at the portion having a strong electric field, and the dielectric cover having a small thickness covers the cathode electrode at the portion having a weak electric field, thereby being able to make the electric field distribution in plasma uniform. For example, when the node of the standing wave is generated at the position A—A of the columnar cathode electrode 103 as shown in FIG. 4, the cathode electrode 103 having a plurality of level differences may be covered with the dielectric cover 104 having a small thickness near the position A—A as shown in FIG. 7. At the position covered with the dielectric cover having a small thickness, since the distance between the cathode electrode and the plasma becomes narrower than any other positions. Therefore, the high frequency power is easily absorbed in the plasma, whereby the distribution of electric field can be more uniform in the plasma.

The present invention has been completed based upon the result of the above consideration.

Henceforth, the present invention will be explained with reference to the accompanying drawings.

Figure 8:
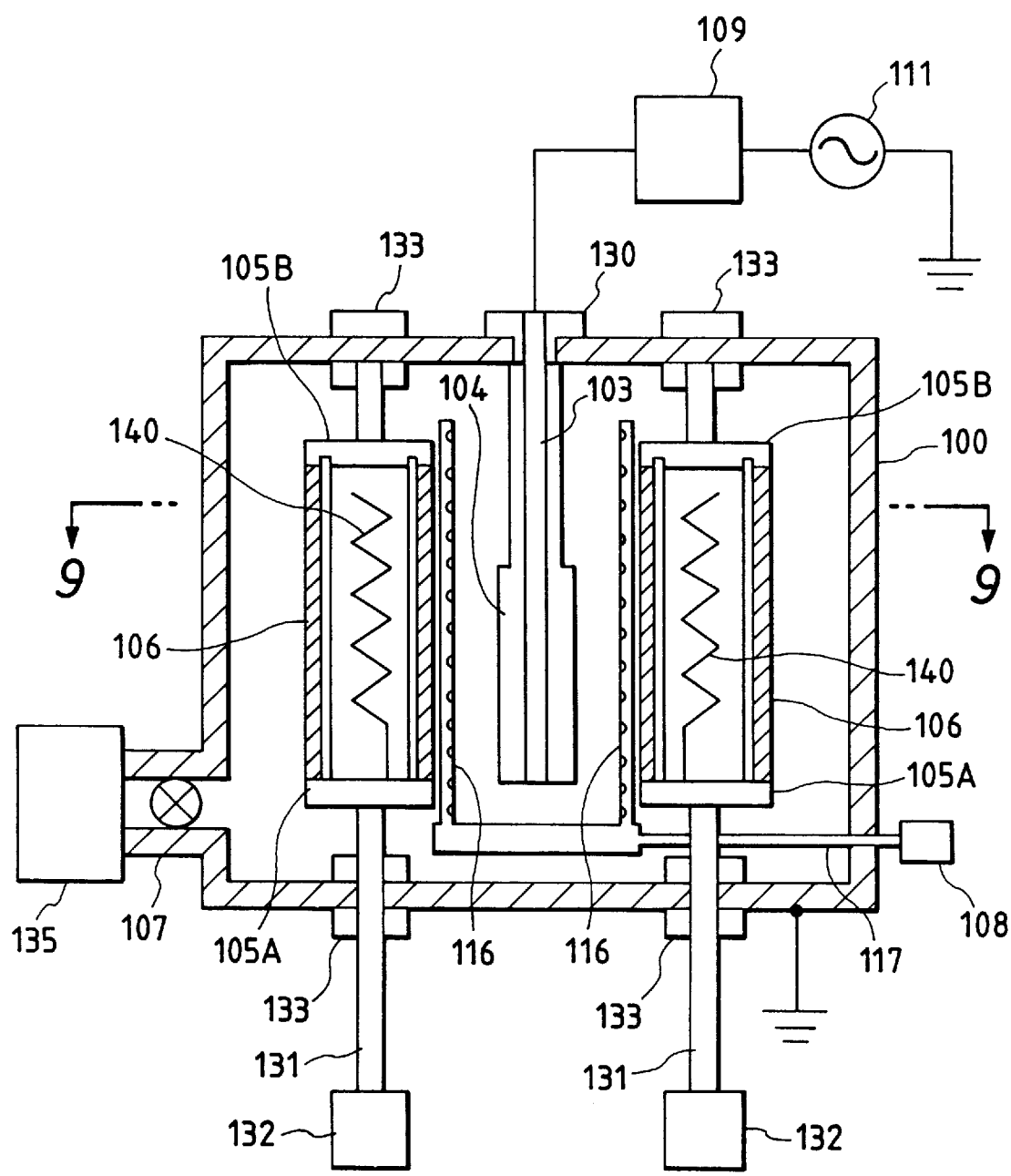
FIGS. 8 and 9 are schematic cross-sectional views showing an example of the plasma processing apparatus, respectively.
Figure 9:
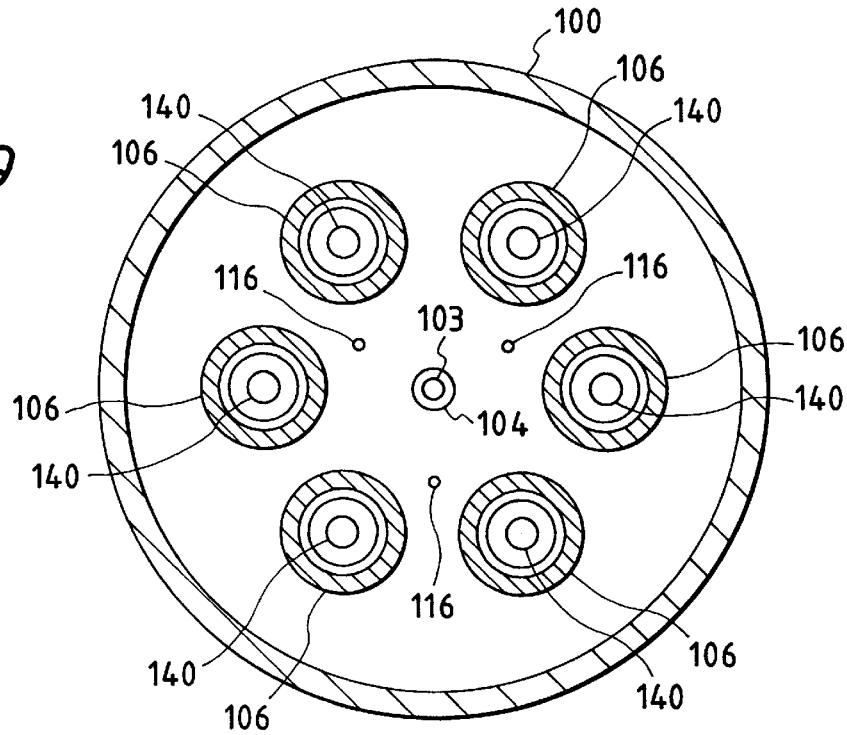

The plasma CVD apparatus shown in FIGS. 8 and 9 shows a preferred example of the plasma CVD apparatus according to the present invention.

FIG. 9 shows a typical cross-sectional view taken in the line 9—9 of FIG. 8. In FIGS. 8 and 9, numeral 100 denotes the reaction vessel.

Six substrate holders 105A are concentrically arranged at a predetermined distance in the reaction vessel 100.

Numeral 106 denotes a cylindrical substrate for forming a film thereon arranged on each substrate holder 105A. A heater 140 is arranged in the inner portion of each substrate holder 105A so that the cylindrical substrate 106 may be heated from the inner side.

Furthermore, each substrate holder 105A is connected to the shaft 131 coupled to the motor 132 so that the substrate holder 105A may be rotated. Numeral 105B denotes the auxiliary holding member of the cylindrical substrate 106. Numeral 103 denotes a cathode electrode for introducing a high frequency power located at the center portion of the plasma generating region. The cathode electrode 103 is connected to a high frequency power source 111 via a matching circuit 109.

A dielectric cover 104 with a level difference is covered with the cathode electrode 103. Numeral 130 denotes a cathode electrode support member. Numeral 107 denotes an evacuation pipe provided with an evacuation valve. The evacuation pipe is communicated with an evacuation mechanism 135 provided with a vacuum pump.

Numeral 108 denotes a starting gas supply system comprising a gas cylinder, a mass flow controller, a valve and the like.

The starting gas supply system 108 is connected to a gas discharge pipe 116 provided with a plurality of gas discharge ports via the gas supply pipe 117. Numeral 133 denotes a seal member.

In case of using this apparatus, the plasma processing, as an example thereof, plasma CVD is carried out as follows.

After the reaction vessel 100 is evacuated by the evacuation mechanism 135 until the reaction vessel 100 becomes highly vacuum, the starting gas is introduced into the reaction vessel 100 from the gas supply means 108 via the gas supply pipe 117 and the gas discharge pipe 116, to keep the internal pressure of the vessel at a predetermined valve.

Next, a high frequency power is supplied to the cathode electrode 103 by the high frequency power source 111 via the matching circuit 109. Plasma is generated between the cathode electrode and the cylindrical substrate 106, whereby the starting gas is decomposed and excited by the plasma to form a deposited film on the cylindrical substrate 106.

According to the present invention, an example of the structure of a cathode electrode portion is shown in FIG. 5. According to the structure shown in FIG. 5, the dielectric cover 104 is provided with one level difference at the center portion of the dielectric cover. The number and position of the level difference can be optionally selected in view of the frequency of the high frequency power source to be used and the length of the axial direction of the cathode electrode 103.

Figure 10:
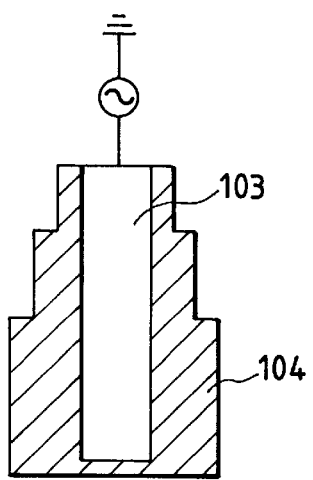
FIGS. 10, 11, 12, 13, 14, 15 and 16 are schematic cross-sectional views showing an example of the cathode electrode, respectively.

For example, as shown in FIG. 10, the dielectric cover may be provided with two levels.

Figure 11:
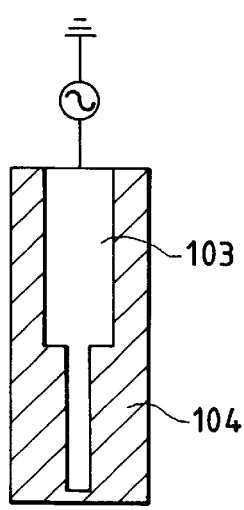
Figure 12:
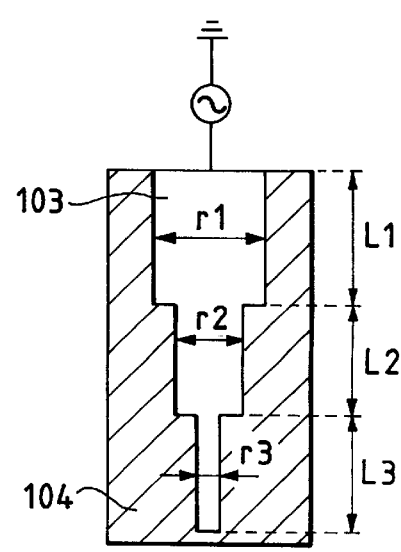
Figure 13:
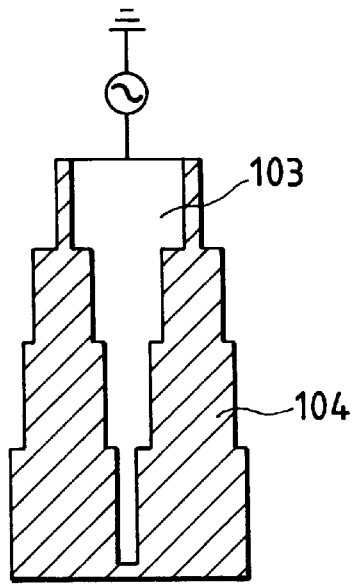

Furthermore, as shown in FIGS. 11 and 12, the cathode electrode 103 may have one or more level differences, and the cathode electrode 103 may be covered with the dielectric cover 104 having an outer surface with no level difference. Furthermore, as shown in FIG. 13, the cathode electrode 103 may have one or more level differences, and the dielectric cover 104 may also have one or more level differences.

Figure 14:
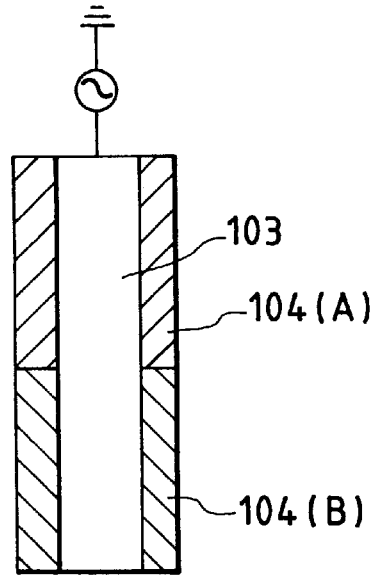
Figure 15:
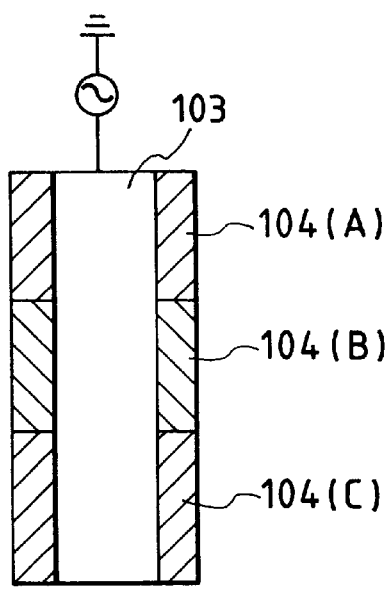

Furthermore, as shown in FIGS. 14 and 15, the cathode electrode 103 may be covered with a plurality of dielectric materials having different dielectric constants. The plurality of dielectric materials may be arranged in such a manner that respective dielectric constants of the dielectric materials may become smaller toward the traveling direction of the incident wave of high frequency.

For example, in FIG. 15, when the dielectric constants of a dielectric cover 104(A), a dielectric cover 104(B) and a dielectric cover 104(C) are defined as a, b and c, respectively, the values of a, b and c preferably have the relationship of a>b>c.

Figure 16:
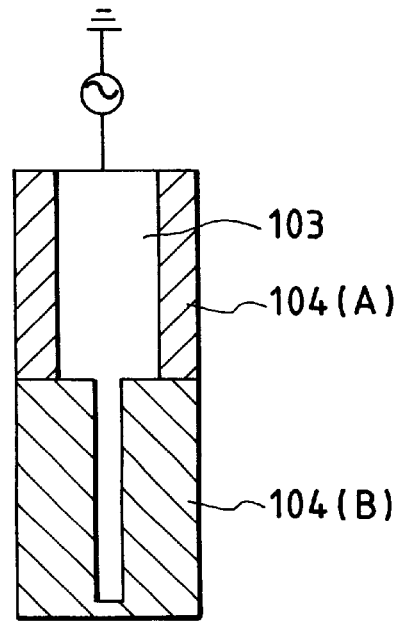

Furthermore, as shown in FIG. 16, the following structure may be used. That is, the cathode electrode 103 has a level difference, and the periphery thereof is covered with a plurality of dielectric materials having different dielectric constants in such a manner that the dielectric constants of respective dielectric materials become smaller toward the traveling direction of the incident wave of high frequency.

Figure 17:
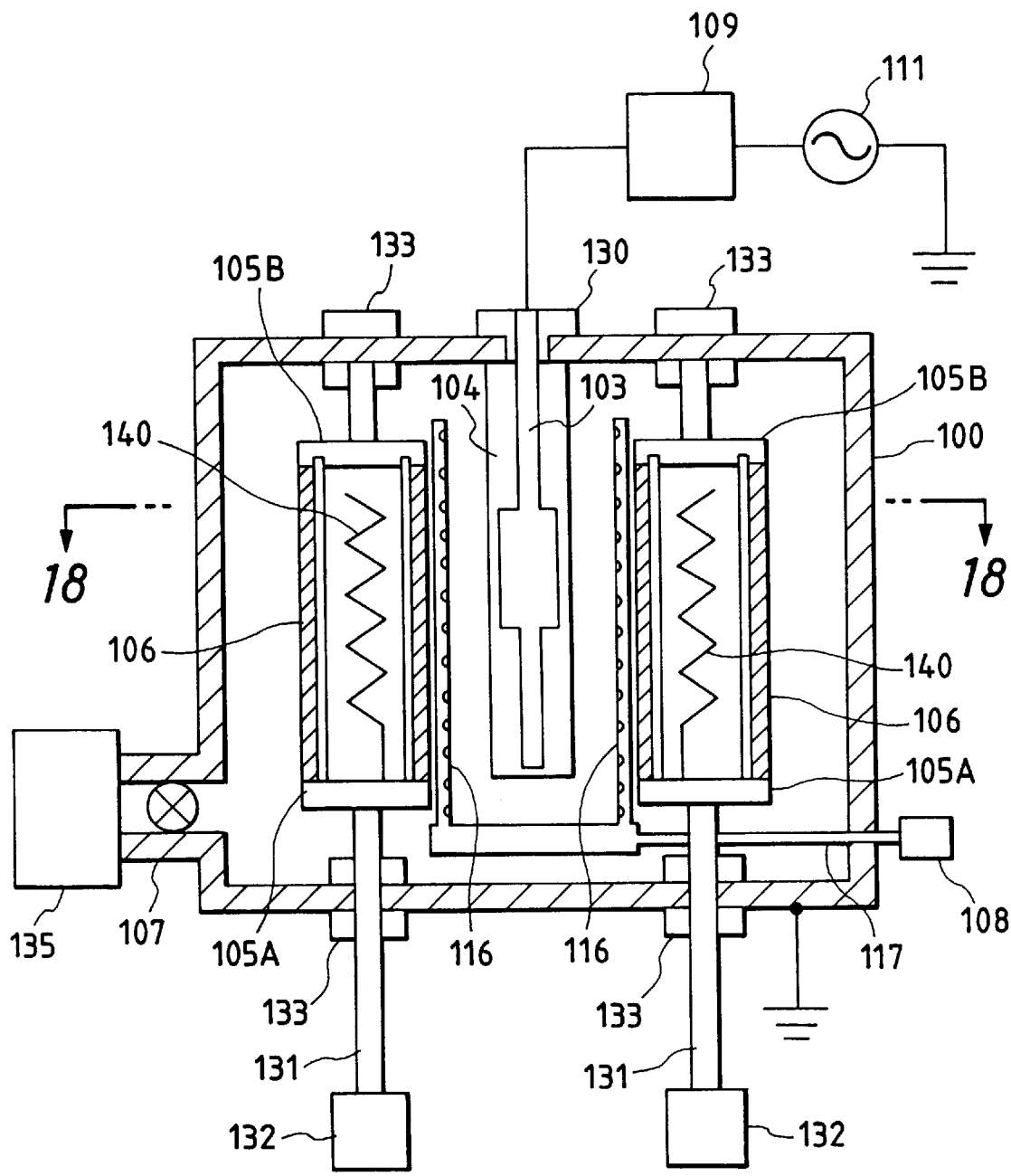
FIGS. 17 and 18 are schematic cross-sectional views showing an example of the plasma processing apparatus, respectively.
Figure 18:
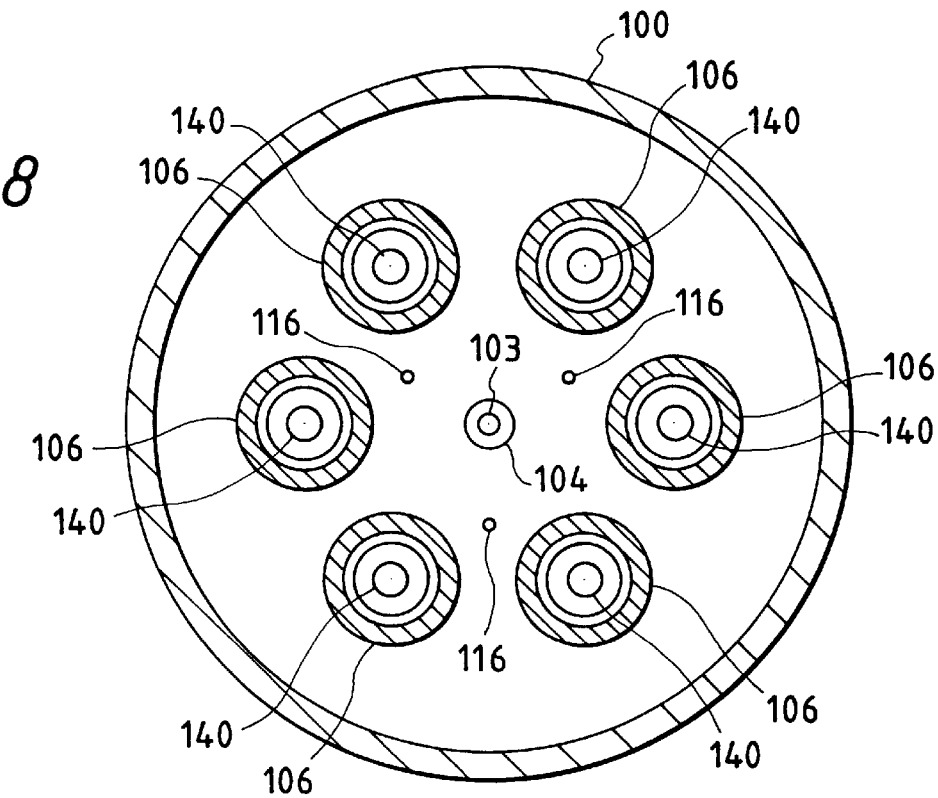

The plasma CVD apparatus shown in FIGS. 17 and 18 shows an example of another plasma processing apparatus according to the present invention. FIG. 18 is a cross-sectional view taken in the line 18—18 of FIG. 17. In FIGS. 17 and 18, numeral 100 denotes a reaction vessel. Similarly to the above case, in FIGS. 17 and 18, six substrate holders 105A are concentrically arranged at a predetermined distance in the reaction vessel 100. Numeral 106 denotes a cylindrical substrate for forming a film thereon arranged on each substrate holder 105A. A heater 140 is arranged in the inner portion of each substrate holder 105A so that the cylindrical substrate 106 may be heated from the inner side. Furthermore, each substrate holder 105A is connected to the shaft 131 coupled to the motor 132 so that the substrate holder 105A may be rotated. Numeral 105B denotes an auxiliary holding member for the cylindrical substrate 106. Numeral 103 denotes a cathode electrode for introducing a high frequency power located at the center portion of the plasma generating region. The cathode electrode 103 is connected to a high frequency power source 111 via a matching circuit 109. The cathode electrode 103 having level differences is covered with a dielectric cover 104 whose thickness becomes nonuniform in the axial direction of the cathode electrode. Numeral 130 denotes the cathode electrode support member. Numeral 107 denotes an evacuation pipe provided with an evacuation valve. The evacuation pipe is communicated with an evacuation mechanism 135 provided with a vacuum pump. Numeral 108 denotes the starting gas supply system comprising a gas cylinder, a mass flow controller, a valve and the like. The starting gas supply system 108 is connected to the gas discharge pipe 116 provided with a plurality of gas discharge ports via the gas supply pipe 117. Numeral 133 denotes a seal member.

In case of using this apparatus, plasma CVD is carried out, for example, as follows. After the reaction vessel 100 is evacuated by the evacuation mechanism 135 until the reaction vessel 100 becomes highly vacuum, the starting gas is introduced into the reaction vessel 100 from the gas supply means 108 via the gas supply pipe 117 and the gas discharge pipe 116, and the internal pressure of the vessel is kept at a predetermined valve. Next, a high frequency power is supplied to the cathode electrode 103 from the high frequency power source 111 via the matching circuit 109. Plasma is generated between the cathode electrode and the cylindrical substrate 106, whereby the starting gas is decomposed and excited by the plasma, and a deposited film is formed on the cylindrical substrate 106.

Figure 19:
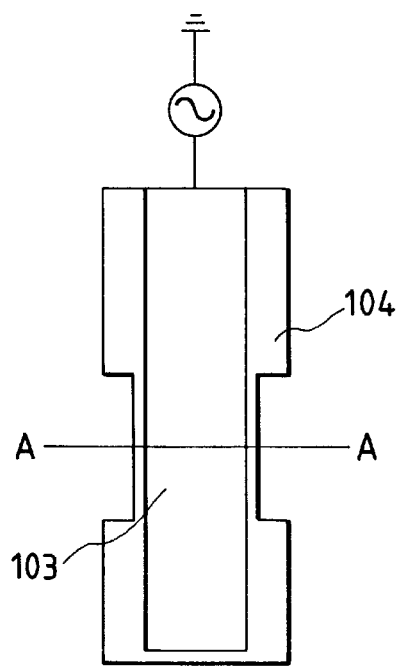
FIGS. 19 and 20 are schematic cross-sectional views showing an example of the cathode electrode, respectively.
Figure 20:
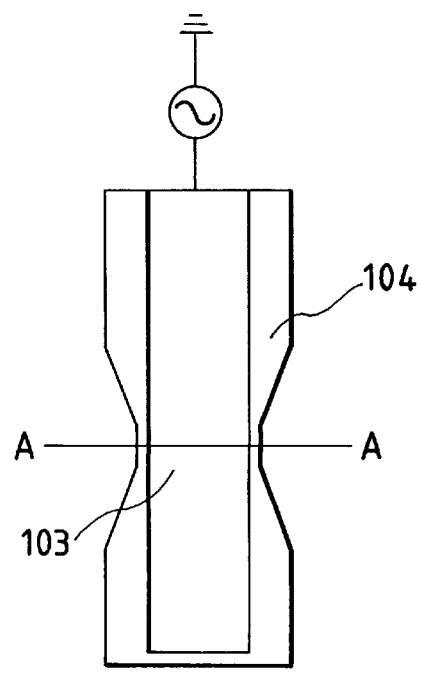

According to the present invention, one example of the structure of the cathode electrode portion is shown in FIG. 7. However, as shown in FIG. 19, the shape of the cathode electrode may be simply columnar, and the center portion at the outer side surface of the dielectric cover 104 may be provided with a concave portion, whereby the thickness of the concave portion may be small. Furthermore, as shown in FIG. 20, the thickness of the dielectric cover 104 may be gradually changed over the axial direction of the cathode electrode 103. Furthermore, the position and number of the portion having a small thickness can be optionally selected in view of the frequency of the high frequency power source to be used and the length of the axial direction of the cathode electrode 103. That is, when it is considered to the nodes of the standing wave are generated at a plurality of positions on the cathode electrode, the thickness of the dielectric cover can only be reduced near the position considered as the node of the standing wave.

According to the present invention, an optional well-known dielectric material can be selected as the dielectric material used for the dielectric cover 104. A material having less dielectric loss is preferred, and a material having a dielectric dissipation factor of 0.01 or less is preferred. Polymeric dielectric materials such as polytetrafluoroethylene, polytrifluorochloroethylene, polyfluoroethylenepropylene, polyimide, etc. are preferred. Glass materials such as a silica glass, a borosilicate glass, etc. are preferred. Porcelain materials such as a porcelain comprising as a main component a single or a plurality of element oxides such as boron nitride, silicon nitride, aluminum nitride, aluminum oxide, magnesium oxide, silicon oxide are preferred.

According to the present invention, preferably, the shape of the cathode electrode is a columnar shape, a cylindrical shape, polygonal columnar shape and the like.

Furthermore, according to the present invention, preferably, the frequency of the high frequency power source is ranging from 30 to 600 MHz. More preferably, the frequency is ranging from 60 to 300 MHz.

Figure 21:
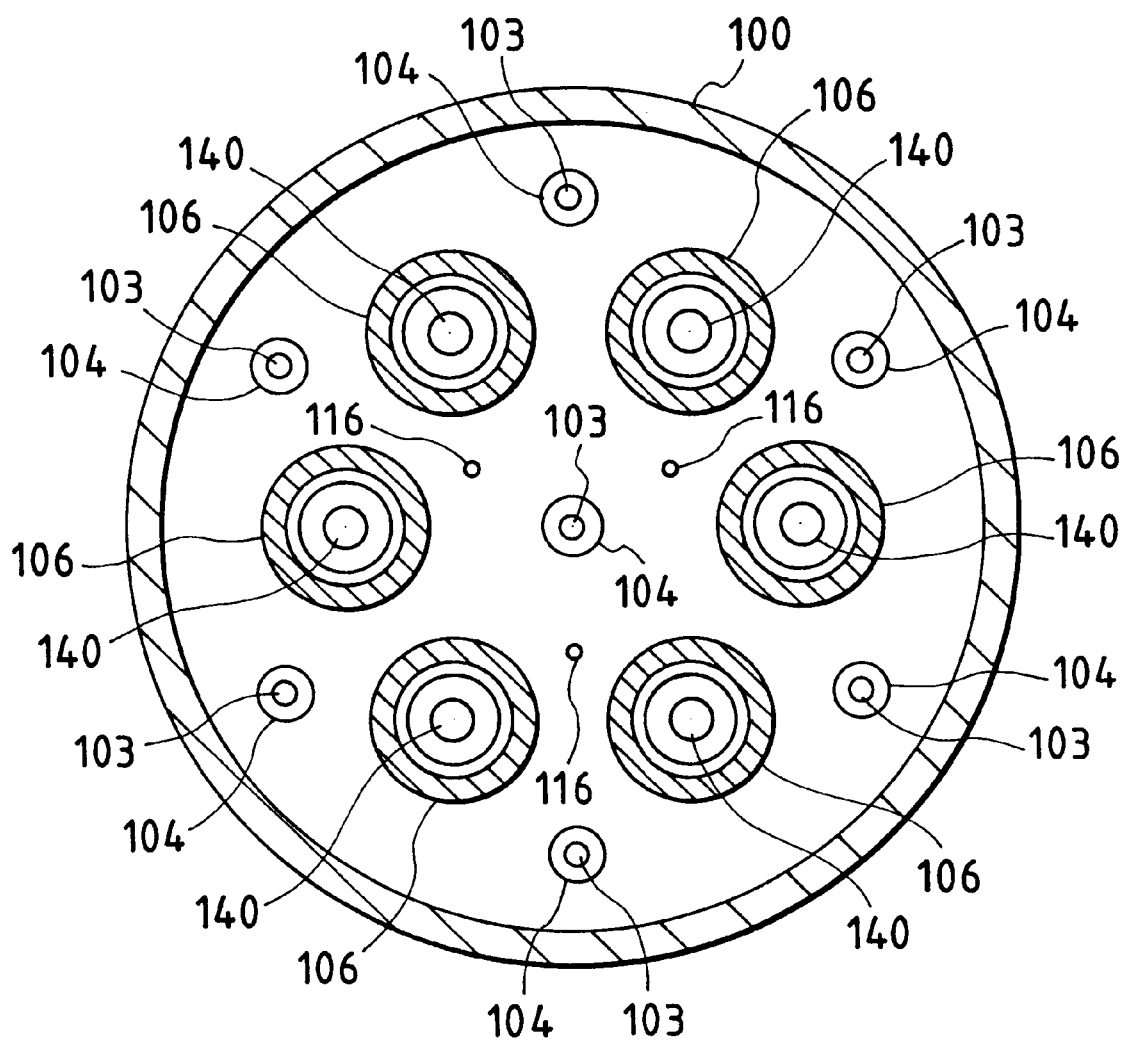
FIG. 21 is a schematic cross-sectional view showing an example of the plasma processing apparatus.

According to the present invention, as shown in FIG. 21, the apparatus may be so constructed that a plurality of cathode electrodes 103 are arranged around the cylindrical substrates 106. This makes it possible to usually expose the surface of all the periphery of the cylindrical substrate to plasma when a film is formed. Accordingly, the deposition rate can be largely enhanced, whereby the productivity can be largely enhanced. Furthermore, when the number and arranged position of the cathode electrode are optimized, an uniform deposited film can be formed on the surface of all the periphery of the substrate without rotating the cylindrical substrates. In this case, a rotating mechanism is not necessary, and therefore the apparatus structure can be simplified. Furthermore, by rotating the cylindrical substrates are further more uniform deposited film can be formed.

Figure 22A:
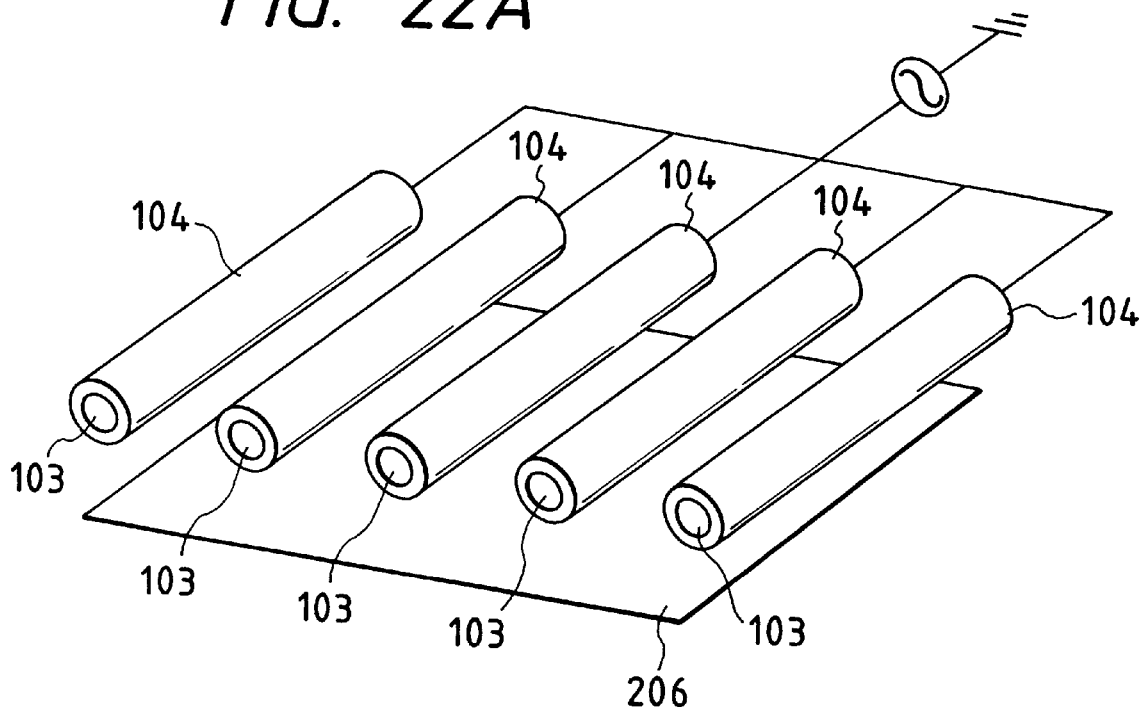
FIGS. 22A, 22B, 23A and 23B are schematic perspective views showing an example of the plasma processing apparatus, respectively.
Figure 22B:
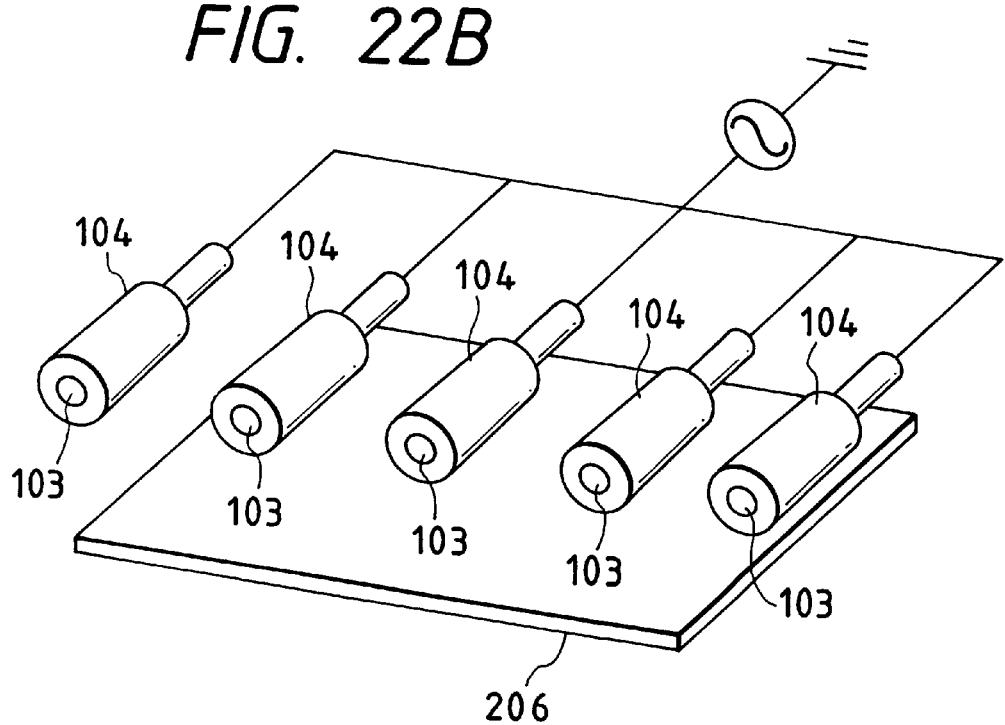

According to the present invention, as shown in FIGS. 22A and 22B, the apparatus may be so constructed that a plurality of cathode electrodes 103 are arranged parallel to a plane plate-shaped substrate 206. Thereby, the deposited film having a high quality such as an extremely uniform film thickness and an uniform film quality can be formed at high speed on the plane plate-shaped substrate having a large area.

Figure 23A:
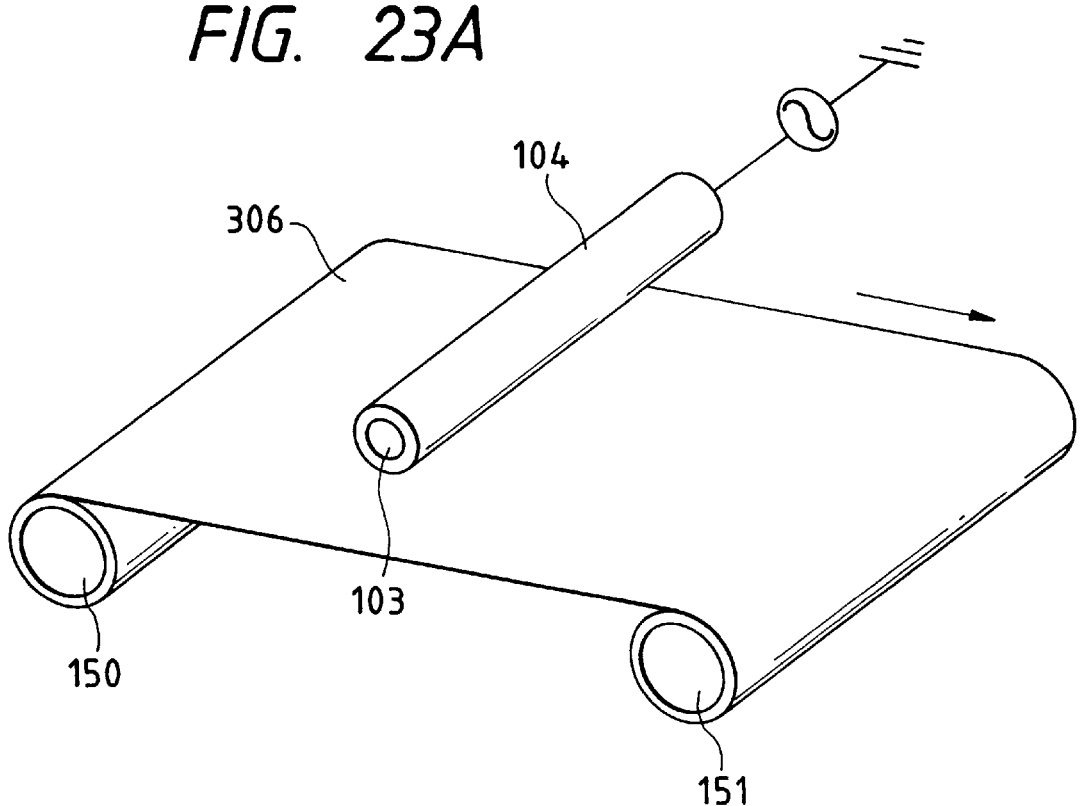
Figure 23B:
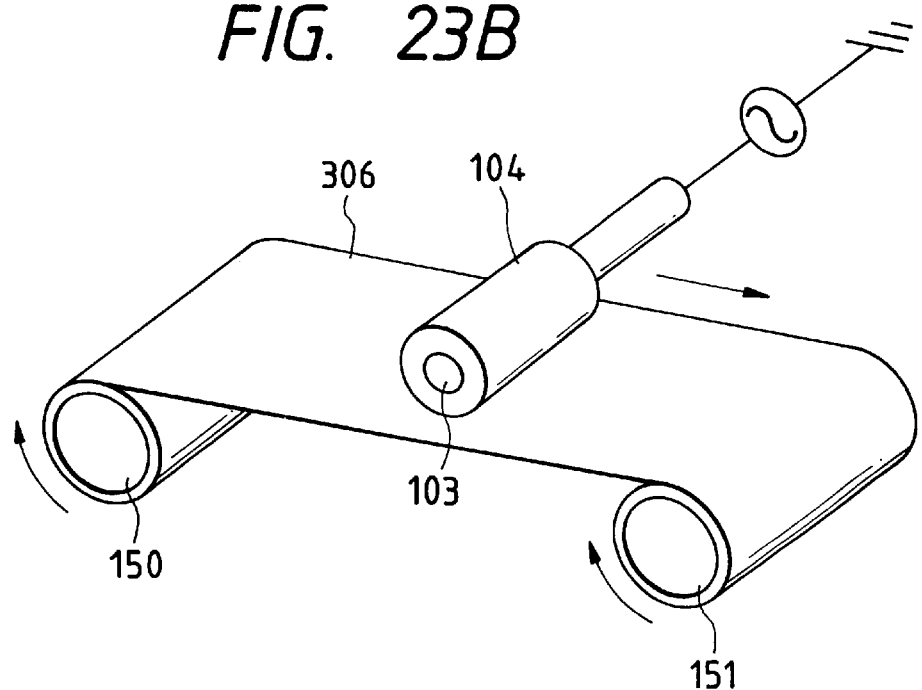

According to the present invention, as shown in FIGS. 23A and 23B, the apparatus may be so constructed that a single cathode electrode 103 or a plurality of cathode electrodes 103 is/are arranged parallel to a sheet-shaped substrate 306 which is transmitted from a holding roll 150 and wound up by a wind-up roll 151 when the film is formed. Thereby, the deposited film having such a high quality as the extremely uniform film thickness and the uniform film quality can be formed at high speed on the sheet-shaped substrate having a large area.

When the plasma CVD apparatus according to the present invention is used, the starting gas for forming a well-known film can be appropriately selected and used as the gas to be used according to a kind of the deposited film to be formed. For example, when a-Si deposited film is formed, as a preferable, the starting gas, silane, disilane, high-order silane, etc. or a mixed gas of them are used. When other deposited films are formed, for example, the starting gas such as germane, methane, ethylene, etc. or the mixed gas of them are used. In any case, the starting gas for the film formation can be introduced into the reaction vessel together with a carrier gas. Hydrogen gas and an inert gas such as argon gas, helium gas, etc. can be used as the carrier gas.

A characteristic for improving gas can be used in order to adjust the bandgap of a deposited film. As the gas, for example, a gas containing a nitrogen atom such as gases of nitrogen, ammonia, etc., a gas containing an oxygen atom such as gases of oxygen, nitric oxide, dinitric oxide, etc., a hydrocarbon gas such as gases of methane, ethane, ethylene, acetylene, propane, etc., a gaseous fluoride compound such as silicon tetrafluoride, disilicon hexafluoride, germanium tetrafluoride, etc. or the mixed gas of them can be used.

In order to dope the deposited film to be formed, a dopant gas can be used. For example, gaseous diborane, boron fluoride, phosphine, phosphorus fluoride, etc. can be used as such a dopant gas.

When the deposited film is formed, the substrate temperature can be appropriately set. When the a-Si type deposited film is formed, the temperature is preferably from 60 to 400° C., and more preferably from 100 to 350° C.

When etching and ashing are carried out, an necessary gas is introduced and used. Concretely, a halogen type etching gas ($CF_4$, $CClF_3$, etc.) and $O_2$ gas can be used. Naturally, the etching gas and $O_2$ gas may be mixed with the above carrier gas.

Although the present invention will be concretely explained below in detail with reference to the following Examples, the present invention is not limited to the Examples.

Example 1

The high frequency power source 111 of the apparatus shown in FIGS. 8 and 9 was the power source which can oscillate the frequency ranging from 30 MHz to 600 MHz. The apparatus connected to the power source was used. As shown in FIGS. 5 and 10, the cathode electrode was so constructed that the columnar cathode electrode 103 with no level difference was covered with the dielectric cover 104 made of alumina ceramics with a level difference. As shown in Table 7, other film formation conditions were the same as those of Experiment 1 as described above. The film formation procedure is the same as that of Experiment 1. According to the above conditions and procedure, an amorphous silicon film was formed on the cylindrical substrate 106 and the substrate for evaluating the electrical characteristics.

Referring to the experimental results shown in Tables 1 to 3, the dielectric cover 104 was provided with the level differences having a height of about 5 mm near the center portion of the position where the film quality was ubiquitously deteriorated when the film was formed by using the apparatus which was not provided with the dielectric cover 104 having the level difference.

The film quality, the distribution of the film quality, the deposition rate and the distribution of the deposition rate of the amorphous silicon film formed in the above manner were evaluated by the same evaluation method as used in Experiment 1. The evaluated results of the photosensitivity of the samples formed under the pressure conditions of 50 mTorr, 25 mTorr, 5 mTorr are shown in Tables 8, 9 and 10, respectively. The evaluated results of the deposition rate are shown in Tables 11, 12 and 13.

Relating to the samples formed by the high frequency energy having the frequency of 30 MHz, all the samples formed under the pressure condition of 50 mTorr had the photosensitivity ranging from $8 \times 10^3$ to $2 \times 10^4$, and there was no practical problem. The average deposition rate was 0.5 nm/s, and the distribution of the deposition rate was 6%. All the samples formed under the pressure condition of 25 mTorr had the photosensitivity ranging from $1 \times 10^4$ to $3 \times 10^4$, and they have a good film characteristic. The average deposition rate was 0.5 nm/s, and the distribution of the deposition rate was 6%. Furthermore, under the pressure condition of 5 mTorr, discharge could not be generated.

Relating to the samples formed by the high frequency energy having the frequency of 60 MHz to 300 MHz, all the samples formed under the pressure condition of 50 mTorr had the photosensitivity ranging from $1 \times 10^4$ to $3 \times 10^4$, and they had a good film characteristic. The average deposition rate was 1 to 1.8 nm/s, and the distribution of the deposition rate was 4 to 6%. All the samples formed under the pressure condition of 25 mTorr had the photosensitivity ranging from $4 \times 10^4$ to $8 \times 10^4$, and they had a good film characteristic. The average deposition rate was 0.9 to 2.0 nm/s, and the distribution of the deposition rate was 4 to 5%. All the samples formed under the pressure condition of 5 mTorr had the photosensitivity ranging from $1 \times 10^5$ to $5 \times 10^5$, and they had an extremely excellent film characteristic. The average deposition rate was 1.0 to 1.7 nm/s, and the distribution of the deposition rate was 4%.

Relating to the samples formed by the high frequency energy having the frequency of 400 MHz to 600 MHz, all the samples formed under the pressure condition of 50 mTorr had the photosensitivity ranging from $7 \times 10^3$ to $1 \times 10^4$, and there was no practical problem. The average deposition rate was 0.6 to 0.7 nm/s, and the distribution of the deposition rate was 6 to 8%. All the samples formed under the pressure condition of 25 mTorr had the photosensitivity ranging from $1 \times 10^4$ to $3 \times 10^4$, and they had a good film characteristic. The average deposition rate was 0.6 to 0.7 nm/s, and the distribution of the deposition rate was 6 to 8%. All the samples formed under the pressure condition of 5 mTorr had the photosensitivity ranging from $5 \times 10^4$ to $8 \times 10^4$, and they had a good film characteristic. The average deposition rate was 0.5 to 0.7 nm/s, and the distribution of the deposition rate was 6 to 7%.

Example 2

The apparatus shown in FIGS. 8 and 9 was used. The electrophotographic photosensitive member was formed under the conditions which were obtain the photosensitivity of $10^5$ or more in Example 1, that is, under the conditions that the pressure condition was 5 mTorr, and the power source frequency was 60 MHz, 100 MHz, 200 MHz and 300 MHz, respectively.

Additionally, the dielectric cover 104 made of alumina ceramics having the same shape as the dielectric cover used under the pressure condition of 5 mTorr in the above Example 1 was used under the above conditions of each power source frequency.

An electrophotographic photosensitive member was formed by sequentially forming a charge injection preventing layer, a photoconductive layer and a surface protecting layer on six cylindrical substrate made of Al under the conditions shown in Table 14. A charge performance, an image density and a defective image of the samples formed under the conditions of each power source frequency were evaluated. As a result, as to the evaluated items, very excellent results were obtained over entire the surface of any electrophotographic photosensitive member.

Accordingly, it was revealed that any electrophotographic photosensitive member had an excellent electrophotographic characteristic.

Example 3

The apparatus shown in FIG. 2 was used, and six cylindrical substrates 106 made of Al having the diameter of 108 mm, the length of 358 mm and the thickness of 5 mm were arranged in the reaction vessel 100. A film was formed without rotating the substrates. The cathode electrode having the same structure as the structure shown in FIG. 11 was used. That is, the columnar cathode electrode 103 made of Al with the level difference having the height of about 10 mm at the center portion of the length of 450 mm in the axial direction was covered with the dielectric cover 104 made of quartz with no level difference at the outer side surface. As shown in FIG. 21, seven cathode electrodes covered were arranged in the reaction vessel. The high frequency power source having the frequency of 100 MHz was used. Amorphous silicon films were formed on six cylindrical substrates under the conditions shown in Table 15. The deposition rate and the distribution of the deposition rate were evaluated by the following procedure.

Lines were drawn at every about 20 mm in the axial direction of one cylindrical substrate among six cylindrical substrates on which an amorphous silicon film was formed. Lines are drawn at every about 32 mm in the circumferential direction. In this case, at 180 points of intersection, the film thickness was measured by using the eddy-current type film thickness meter used in the above Experiment 1. The deposition rate was calculated at each measurement position, and the average value of the obtained values is defined as the average deposition rate. The obtained average deposition rate is 7.2 nm/s.

In order to obtain the distribution of the deposition rate in the axial direction, the difference between the maximum and minimum values of the deposition rate at eighteen measurement points of one alignment in the axial direction was determined. The difference was divided by the average deposition rate at eighteen points, whereby the average distribution of the deposition rate per alignment was determined. Next, the distribution of the deposition rate per alignment of other nine alignment was similarly determined. The average value of the obtained distributions of the deposition rate at ten alignments was calculated, and this value was represented as the distribution of the deposition rate in the axial direction by percentage. The distribution of the deposition rate in the axial direction is 5%.

In order to obtain the distribution of the deposition rate in the circumferential direction, the difference between the maximum and minimum values of the deposition rate at ten measurement points of one alignment in the circumferential direction was determined. The difference was divided by the average deposition rate at ten points, whereby the distribution of the deposition rate per alignment was determined. Next, the distribution of the deposition rate per alignment of other seventeen alignments was similarly determined. The average value of the obtained distributions of the deposition rate at eighteen alignments was calculated. This value was represented as the distribution of the deposition rate in the circumferential direction by percentage. The distribution of the deposition rate in the circumferential direction was 9%.

Example 4

In the same apparatus structure as the structure used in the example 3, the electrophotographic photosensitive member was formed.

An electrophotographic photosensitive member was formed by sequentially forming a charge injection preventing layer, a photoconductive layer and a surface protecting layer on six cylindrical substrates made of Al under the film formation conditions shown in Table 16. The charge performance, the image density and the defective image of the obtained samples were evaluated.

As a result, as to the evaluated items, very excellent results were obtained over the entire surface of any electrophotographic photosensitive member.

Accordingly, it was revealed that any electrophotographic photosensitive member had an excellent electrophotographic characteristic.

Example 5

In the same manner as in Example 3 except for rotating the substrate during film formation, an amorphous silicon film was formed on six cylindrical substrates.

Similarly to the example 3, the deposition rate and the distribution of the deposition rate were evaluated. The average deposition rate was 7.2 nm/s. The distribution of the deposition rate in the axial direction was 5%. The distribution of the deposition rate in the circumferential direction was 3%.

Example 6

The apparatus shown in FIG. 22B was used. A plane plate-shaped substrate made of glass having a longitudinal length of 500 mm, a transverse length of 500 mm and the thickness of 1 mm was arranged in the reaction vessel, and a film was formed.

As the structure of the cathode electrode, the structure shown in FIG. 14 was used. That is, the columnar cathode substrate 103 made of Al having the length of 600 mm and the diameter of 25 mm was covered with the dielectric cover 104(A) made of alumina ceramics having a relative dielectric constant of 10, the length of 350 mm, the inner diameter of 26 mm and the outer diameter of 38 mm and with the dielectric cover 104(B) made of glass having the relative dielectric constant of 3.9, the length of 250 mm, the inner diameter of 26 mm and the outer diameter of 38 mm. As shown in FIG. 22B, five cathode electrodes were arranged in the reaction vessel.

The high frequency power source having the frequency of 250 MHz was used. An amorphous silicon film was formed on the plane plate-shaped substrate under the condition shown in Table 17. The deposition rate and the distribution of the deposition rate were evaluated by the following procedure.

Lines were drawn at every about 30 mm in the longitudinal direction of plane plate-shaped substrate in which the amorphous silicon film was formed. Lines were also drawn at every about 30 mm in the transverse direction. In this case, at 256 points of intersection, the film thickness was measured by using the eddy-current type film thickness meter used in the above Experiment 1. The deposition rate was calculated at each measurement position, and the average value of the obtained values was defined as the average deposition rate. The obtained average deposition rate was 6.5 nm/s.

In order to obtain the distribution of the deposition rate, the difference between the maximum and minimum values of the deposition rate at 256 measurement points was determined. The difference was divided by the average deposition rate, and this value was represented by percentage as the distribution of the deposition rate. The obtained distribution of the deposition rate was 8%.

Comparison Example 1

In the same manner as in Example 6 except for that the cathode electrode was not covered with the dielectric cover, an amorphous silicon film was formed on the plane plate-shaped substrate. The deposition rate and the distribution of the deposition rate were evaluated. The average deposition rate was 6.3 nm/s. The distribution of the deposition rate was 35%.

Comparison Example 2

Figure 1:
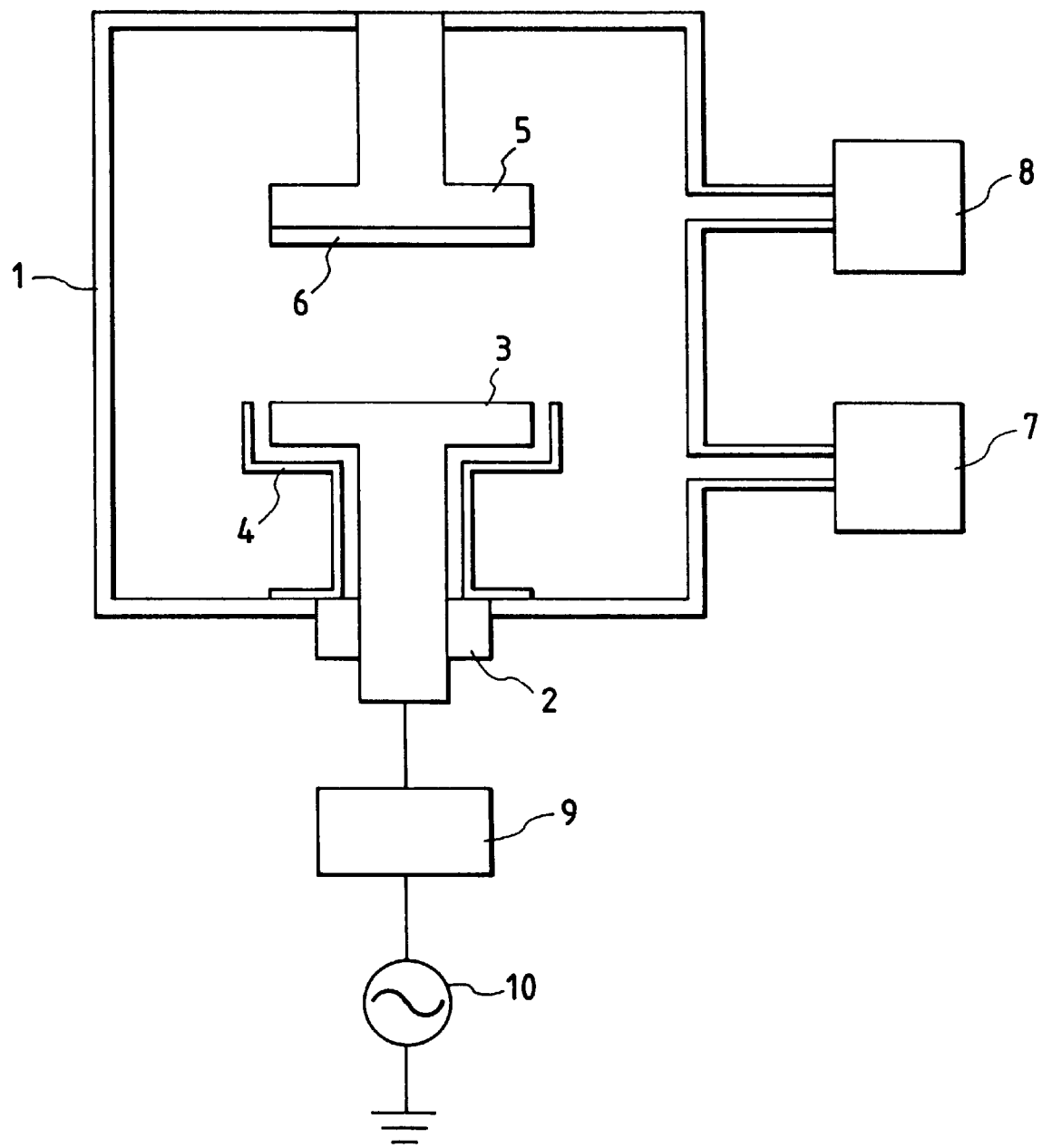
FIGS. 1, 2 and 3 are schematic cross-sectional views showing an example of a plasma processing apparatus, respectively.

The parallel plane plate-shaped apparatus shown in FIG. 1 was used. The plane plate-shaped substrate made of glass having the longitudinal length of 500 mm, the transverse length of 500 mm and the thickness of 1 mm was arranged in the counter electrode 5. An amorphous silicon film was formed on the plane plate-shaped substrate under the film formation conditions shown in Table 18. In the same manner as in Example 6, the deposition rate and the distribution of the deposition rate were evaluated. The average deposition rate was 3.5 nm/s. The distribution of the deposition rate was 85%.

Example 7

The apparatus shown in FIG. 23B was used. A sheet-shaped substrate 306 made of stainless-steel having the width of 500 mm and the thickness of 0.1 mm was arranged in the reaction vessel. While the substrate is wound up, a film was formed.

As the structure of the cathode electrode, the structure shown in FIG. 12 was used. That is, the columnar cathode electrode 103 made of Al with two level differences having r1=40 mm, r2=30 mm, r3=20 mm, L1=200 mm, L2=300 mm and L3=100 mm was covered with the dielectric cover 104 made of alumina ceramics having the outer diameter of 45 mm. One cathode electrode was arranged in the reaction vessel.

The high frequency power source having the frequency of 550 MHz was used. An amorphous silicon film was formed on the sheet-shaped substrate under the film formation conditions shown in Table 19. The sheet-shaped substrate having the length of 500 mm was cut out. The deposition rate and the distribution of the deposition rate were evaluated by the same manner as in Example 6. The obtained average deposition rate was 1.5 nm/s. The distribution of the deposition rate was 5%.

Example 8

In the same manner as in Example 4 except for rotating the substrate during film formation, the electrophotographic photosensitive member was formed.

An electrophotographic photosensitive member was formed by sequentially forming a charge injection preventing layer, a photoconductive layer and a surface protecting layer on six cylindrical substrates made of Al under the film formation condition shown in Table 16. The charge performance, the image density and the defective image of the obtained samples are evaluated.

As a result, as to the evaluated items, very excellent results were obtained over the entire surface of any electrophotographic photosensitive member.

Accordingly, it was revealed that any electrophotographic photosensitive member had an excellent electrophotographic characteristic.

Example 9

Figure 24:
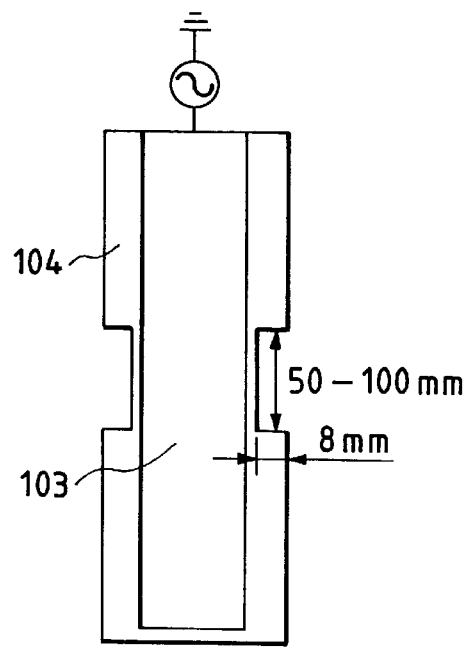
FIGS. 24, 25, 26, 27 and 28 are schematic cross-sectional views showing an example of the cathode electrode, respectively.
Figure 25:
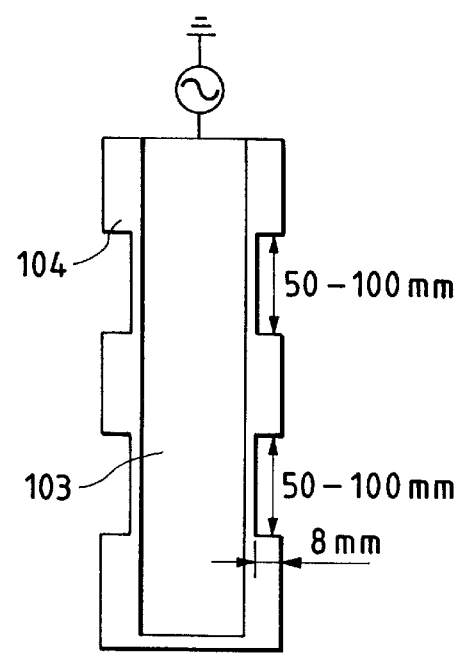

As the high frequency power source 111 of the apparatus shown in FIGS. 17 and 18, the power source which can oscillate the frequency ranging from 30 MHz to 600 MHz was used. The apparatus connected to the power source on demand was used. As shown in FIGS. 24 and 25, the cathode electrode was so constructed that the columnar cathode electrode 103 made of Al having the length of 450 mm and the diameter of 30 mm was covered with the dielectric cover 104 made of alumina ceramics and provided with a single concave portion or a plurality of concave portions at the outer side surface. As shown in Table 7, other film formation conditions were the same as those of Experiment 1. The film formation procedure was similar to Experimental 1. According to the above condition and procedure, an amorphous silicon film was formed on the cylindrical substrate 106 and the substrate for evaluating the electrical characteristic.

Referring to the experimental results shown in Tables 1 to 3, the dielectric cover 104 was provided with concave portions each having a depth of about 8 mm and the length of about 50 to 100 mm near the center portion of the position where film quality was ubiquitously deteriorated when a film was formed by using the conventional apparatus not provided with the dielectric cover 104 having the concave portion. Thereby, the thickness of the dielectric cover was nonuniform over the axial direction of the cathode electrode. The film quality, the distribution of the film quality, the deposition rate and the distribution of the deposition rate of the amorphous silicon film formed according to the above conditions and procedure were evaluated by the same evaluation method as in Experiment 1. The evaluated results of the photosensitivity of the samples formed under the pressure conditions of 50 mTorr, 25 mTorr and 5 mTorr are shown in Tables 20, 21 and 22, respectively. The evaluated results of the deposition rate of the samples are shown in Tables 23, 24 and 25.

Relating to the samples formed by the high frequency energy having the frequency of 30 MHz, all the samples formed under the pressure condition of 50 mTorr had the photosensitivity ranging from $8 \times 10^3$ to $2 \times 10^4$, and there was no practical problem. The average deposition rate was 0.5 nm/s, and the distribution of the deposition rate was 6%. All the samples formed under the pressure condition of 25 mTorr had the photosensitivity ranging from $1 \times 10^4$ to $3 \times 10^4$, and they had a good film characteristic. The average deposition rate was 0.5 nm/s, and the distribution of the deposition rate was 6%. Furthermore, under the pressure condition of 5 mTorr, discharge could not be generated.

Relating to the samples formed by the high frequency energy having the frequency of 60 MHz to 300 MHz, all the samples formed under the pressure condition of 50 mTorr had the photosensitivity ranging from $1 \times 10^4$ to $3 \times 10^4$, and they had a good film characteristic. The average deposition rate was 1 to 1.8 nm/s, and the distribution of the deposition rate was 4 to 6%. All the samples formed under the pressure condition of 25 mTorr had the photosensitivity ranging from $4 \times 10^4$ to $8 \times 10^4$, and they had a good film characteristic. The average deposition rate was 0.9 to 2.0 nm/s, and the distribution of the deposition rate was 4 to 5%. All the samples formed under the pressure condition of 5 mTorr had the photosensitivity ranging from $1 \times 10^5$ to $5 \times 10^5$, and they had an extremely excellent film characteristic. The average deposition rate was 1.0 to 1.7 nm/s, and the distribution of the deposition rate was 4%.

Relating to the samples formed by the high frequency energy having the frequency of 400 MHz to 600 MHz, all the samples formed under the pressure condition of 50 mTorr had the photosensitivity ranging from $7 \times 10^3$ to $1 \times 10^4$, and there was no practical problem. The average deposition rate was 0.6 to 0.7 nm/s, and the distribution of the deposition rate was 6 to 8%. All the samples formed under the pressure condition of 25 mTorr had the photosensitivity ranging from $1 \times 10^4$ to $3 \times 10^4$, and they had a good film characteristic. The average deposition rate was 0.6 to 0.7 nm/s, and the distribution of the deposition rate was 6 to 8%. All the samples formed under the pressure condition of 5 mTorr had the photosensitivity ranging from $5 \times 10^4$ to $8 \times 10^4$, and they had a good film characteristic. The average deposition rate was 0.5 to 0.7 nm/s, and the distribution of the deposition rate was 6 to 7%.

Example 10

The apparatus shown in FIGS. 17 and 18 was used. The electrophotographic photosensitive member was formed under the conditions which could obtain the photosensitivity of $10^5$ or more in Example 9, that is, the conditions that the pressure condition was 5 mTorr, and the power source frequency was 60 MHz, 100 MHz, 200 MHz and 300 MHz, respectively. Additionally, dielectric cover 104 made of alumina ceramics having the same shape as that of the dielectric cover used under the pressure condition of 5 mTorr in Example 1 was used at each power source frequency.

An electrophotographic photosensitive member was formed by sequentially forming a charge injection preventing layer, a photoconductive layer and a surface protecting layer on six cylindrical substrates made of Al under the film formation condition shown in Table 26. The charge performance, the image density and the defective image of the samples formed under the condition of each power source frequency were evaluated. As a result, as to the evaluated items, very excellent results were obtained over the entire surface of any electrophotographic photosensitive member.

Accordingly, it was revealed that any electrophotographic photosensitive member had an excellent electrophotographic characteristic.

Example 11

Figure 26:
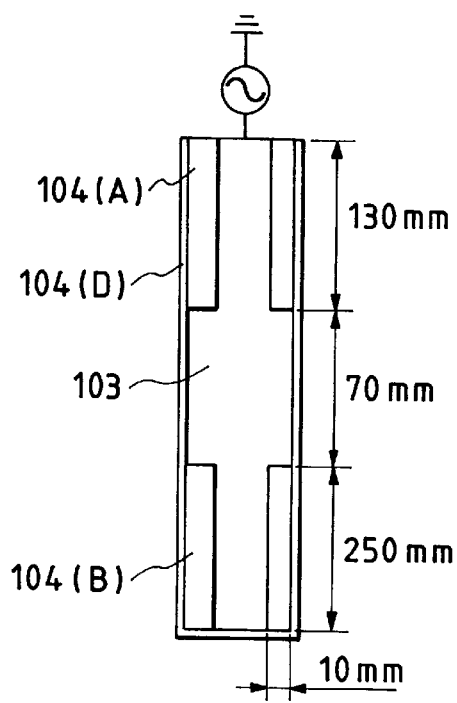

The apparatus shown in FIG. 21 was used, and six cylindrical substrates 106 made of Al having the diameter of 108 mm, the length of 358 mm and the thickness of 5 mm were arranged in the reaction vessel 100. A film was formed without rotating the substrate. The cathode electrode having the same structure as the structure shown in FIG. 26 was used. That is, the columnar cathode electrode 103 made of Al having the length of 450 mm had the convex portion having the height of about 10 mm and the length of about 70 mm at the center portion in the axial direction, and portions having the small outer diameter of the cathode electrode was covered with the dielectric covers 104(A) and 104(B) made of quartz each having the thickness of about 10 mm. The cathode electrode 103 and the dielectric covers were further covered with a dielectric cover having the thickness of about 1 mm. Substantially, the cathode electrode was covered with a cover having a nonuniform thickness over the axial direction of the cathode electrode 103. As shown in FIG. 21, seven cathode electrodes were arranged in the reaction vessel. The high frequency power source having the frequency of 100 MHz was used. Amorphous silicon films were formed on six cylindrical substrates under the film formation condition shown in Table 27. The deposition rate and the distribution of the deposition rate were evaluated by the following procedure.

Lines were drawn at every about 20 mm in the axial direction of one cylindrical substrate among six cylindrical substrates in which the amorphous silicon film was formed. The lines were drawn at every about 32 mm in the circumferential direction. In this case, at 180 points of intersection, the film thickness was measured by using the eddy-current type film thickness meter used in the above Experiment 1. The deposition rate was calculated at each measurement position, and the average value of the obtained values was defined as the average deposition rate. The obtained average deposition rate was 7.2 nm/s. In order to obtain the distribution of the deposition rate in the axial direction, the difference between the maximum and minimum values of the deposition rate at eighteen measurement points in one alignment in the axial direction was determined. The difference was divided by the average deposition rate at eighteen points, whereby the average distribution of the deposition rate per alignment was determined. Next, the distribution of the deposition rate per alignment of other nine alignments was similarly determined. The average value of the obtained distribution of the deposition rate of ten alignments was calculated. This value was represented as the distribution of the deposition rate in the axial direction by percentage. The distribution of the deposition rate in the axial direction was 5%.

In order to obtain the distribution of the deposition rate in the circumferential direction, the difference between the maximum and minimum values of the deposition rate at ten measurement points in one alignment in the circumferential direction was determined. The difference was divided by the average deposition rate at ten points, whereby the distribution of the deposition rate per alignment was determined. Next, the distribution of the deposition rate per alignment of other seventeen alignments was similarly determined. The average value of the obtained distribution of the deposition rate of eighteen alignments was calculated. This value was represented as the distribution of the deposition rate in the circumferential direction by percentage. The distribution of the deposition rate in the circumferential direction was 9%.

Example 12

In the same apparatus structure as the structure used in Example 11, an electrophotographic photosensitive member was formed.

The electrophotographic photosensitive member was formed by sequentially forming a charge injection preventing layer, a photoconductive layer and a surface protecting layer on six cylindrical substrates made of Al under the film formation conditions shown in Table 28. The charge performance, the image density and the defective image of the obtained samples were evaluated. As a result, as to the evaluated items, very excellent results were obtained over the entire surface of any electrophotographic photosensitive member. Accordingly, it was revealed that any electrophotographic photosensitve member had an excellent electrophotographic characteristic.

Example 13

In the same manner as in Example 11 except for rotating the substrate during film formation, an amorphous silicon film was formed on six cylindrical substrates. Similarly to Example 11, the deposition rate and the distribution of the deposition rate were evaluated. The average deposition rate was 7.2 nm/s. The distribution of the deposition rate in the axial direction was 5%. The distribution of the deposition rate in the circumferential direction was 3%.

Example 14

In the same manner as in Example 12 except for rotating the substrate during film formation, an electrophotographic photosensitive member was formed.

The electrophotographic photosensitive member was formed by sequentially forming a charge injection preventing layer, a photoconductive layer and a surface protecting layer on six cylindrical substrates made of Al under the film formation conditions shown in Table 28. The charge performance, the image density and the defective image of the obtained samples were evaluated. As a result, as to the evaluated items, very excellent results were obtained over the entire surface of any electrophotographic photosensitive member. Accordingly, it was revealed that any electrophotographic photosensitive member had an excellent electrophotographic characteristic.

Example 15

Figure 27:
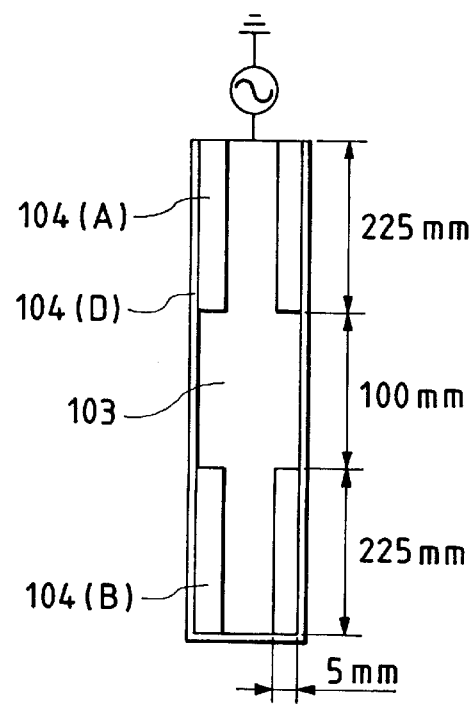

The apparatus shown in FIG. 22A was used. The plane plate-shaped substrate made of glass having the longitudinal length of 500 mm, the transverse length of 500 mm and the thickness of 1 mm was arranged in the reaction vessel, and a film was formed. As shown in FIG. 27, the columnar cathode electrode 103 made of SUS having the length of 550 mm had the convex portion having the height of about 5 mm and the length of about 100 mm near the center portion in the axial direction. The portions of the small outer diameter of the cathode electrode were covered with the dielectric covers 104(A) and 104(B) made of quartz each having the thickness of about 5 mm. The cathode electrode and the dielectric covers were further covered with a dielectric cover 104(D) made of alumina ceramics having the thickness of about 1 mm. The cathode electrode 103 was substantially covered with a dielectric cover having a nonuniform thickness over the axial direction of the cathode electrode 103. As shown in FIG. 22A, five cathode electrodes were arranged in the reaction vessel. The high frequency power source having the frequency of 250 MHz was used. An amorphous silicon film was formed on the plane plate-shaped substrate under the film formation conditions shown in Table 29. The deposition rate and the distribution of the deposition rate were evaluated by the following procedure.

Lines were drawn at every about 30 mm in the longitudinal direction of the plane plate-shaped substrate in which the amorphous silicon film was formed. Lines were also drawn at every about 30 mm in the transverse direction. In this case, at 256 points of intersection, the film thickness was measured by using the eddy-current type film thickness meter used in the above Experiment 1. The deposition rate was calculated at each measurement position, and the average value of the obtained values was defined as the average deposition rate.

The obtained average deposition rate was 6.5 nm/s. In order to obtain the distribution of the deposition rate, the difference between the maximum and minimum values of the deposition rate at 256 measurement points was determined. The difference was divided by the average deposition rate, whereby this value was represented by percentage as the distribution of the deposition rate. The obtained distribution of the deposition rate was 8%.

Comparison Example 3

In the same manner as in Example 7 provided that the simple columnar cathode electrode made of SUS having the length of 550 mm and the diameter of 30 mm was used, and an amorphous silicon film was formed on the plane plate-shaped substrate. The deposition rate and the distribution of the deposition rate were evaluated. The average deposition rate was 6.3 nm/s. The distribution of the deposition rate was 45%.

Comparison Example 4

The parallel plane plate-shaped apparatus shown in FIG. 1 was used. The plane plate-shaped substrate made of glass having the longitudinal length of 500 mm, the transverse length of 500 mm and the thickness of 1 mm wa arranged in the counter electrode 5. An amorphous silicon film was formed on the plane plate-shaped substrate under the film formation condition shown in Table 30. By the same procedure as in Example 15, the deposition rate and the distribution of the deposition rate were evaluated. The average deposition rate was 3.5 nm/s. The distribution of the deposition rate was 85%.

Example 19

The apparatus shown in FIG. 23A was used. The sheet-shaped substrate 306 made of stainless steel having the width of 500 mm and the thickness of 0.1 mm was arranged in the reaction vessel. While the substrate was wound up, a film was formed.

Figure 28:
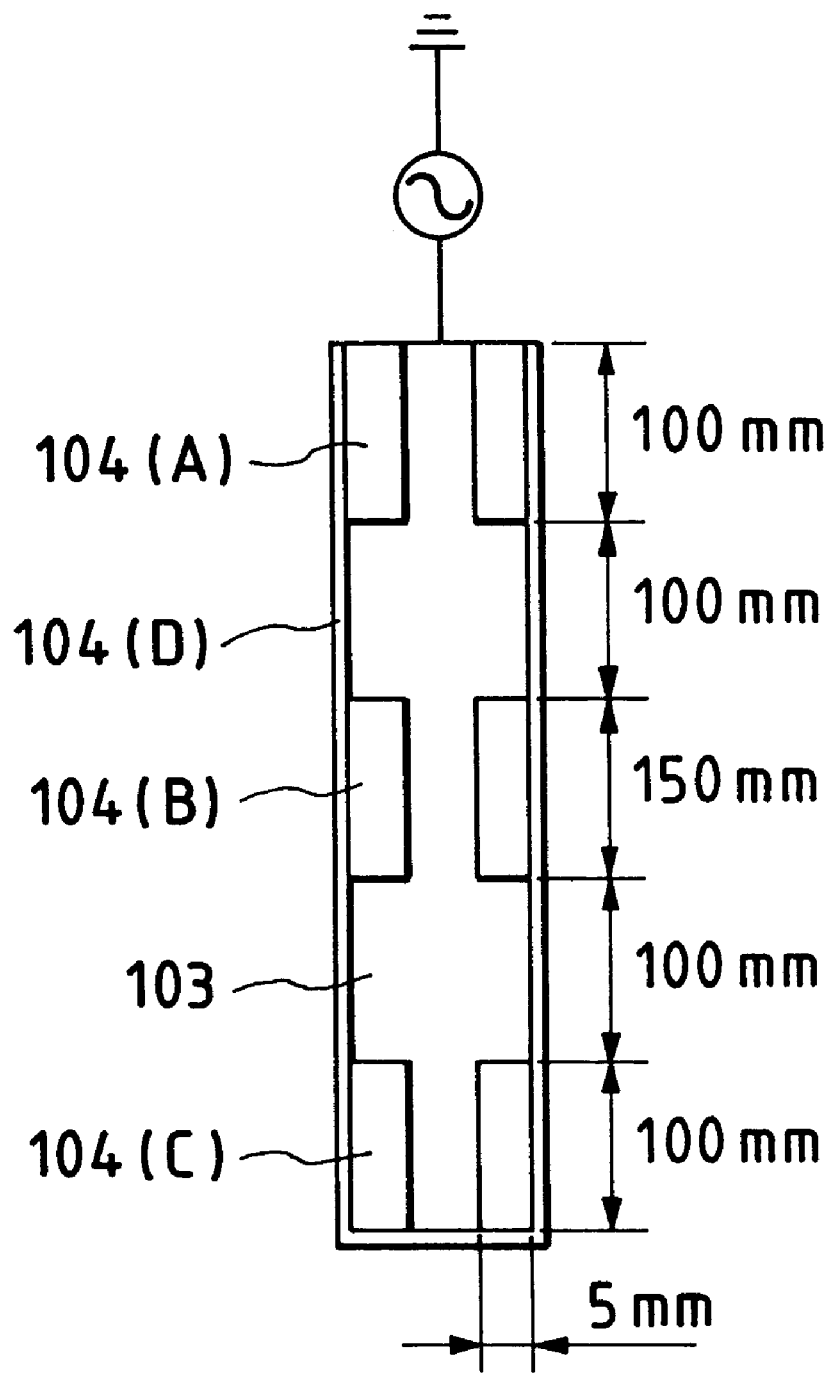

As shown in FIG. 28, the columnar cathode electrode 103 made of aluminum having the length of 550 mm had the convex portion having the height of about 5 mm and the length of about 100 mm at two center. The portions of the small outer diameter of the cathode electrode were covered with the dielectric covers 104(A), 104(B) and 104(C) made of alumina ceramics each having the thickness of about 5 mm. The cathode electrode and the dielectric covers were further covered with the dielectric cover 104(D) made of alumina ceramics each having the thickness of about 1 mm. The cathode electrode 103 was substantially covered with a dielectric cover having a nonuniform thickness over the axial direction of the cathode electrode 103. One cathode electrode was arranged in the reaction vessel.

The high frequency power source having the frequency of 550 MHz was used. An amorphous silicon film was formed on the sheet-shaped substrate under the film formation condition shown in Table 31. The sheet-shaped substrate having the length of 500 mm was cut out. The deposition rate and the distribution of the deposition rate were evaluated by the same procedure as in Example 18. The obtained average deposition rate was 4.5 nm/s. The distribution of the deposition rate was 5%.

As explained above, according to the present invention, since the strength of the generated plasma can be more uniform, the uniform and homogeneous plasma processing of a substrate (or a material to be processed) having a large area can be carried out at high speed. Accordingly, according to the present invention, more high-quality plasma processing can be carried out.

For example, the formation of a deposited film is specifically explained. As explained above, according to the present invention, a deposited film having the high quality of an uniform film thickness and homogeneous film quality can be formed on various shaped substrates having a large area, that is, a cylindrical substrate, a plane plate-shaped substrate, a sheet-shaped substrate and the like.

Furthermore, according to the present invention, in case of the structure comprising a plurality of cylindrical substrates, a deposited film having the high quality of an extremely uniform film thickness and a homogeneous film quality can be formed in both of the axial direction and the circumferential direction of the cylindrical substrate. Therefore, the semiconductor device can be effectively formed.

Furthermore, more specifically, the present invention can preferably be applied to the formation of a deposited film with a large area having the excellent electrophotographic characteristics, whereby the deposited film can be stably mass produced.

TABLE 1

(Pressure condition 50 mTorr)

| Power source frequency | Photosensitivity measurement position — Upper side (high frequency introduction side) ← Center portion → Lower side |||||||||||||||||
|---|---|---|---|---|---|---|---|---|---|---|---|---|---|---|---|---|---|
| 13.56 MHz | B | A | B | A | A | B | A | A | A | A | B | B | A | A | B | A | B |
| 30 MHz | A | B | C | C | B | A | A | B | B | A | B | A | B | A | A | B | A |
| 60 MHz | A | A | B | C | C | C | B | A | A | A | A | A | A | A | A | A | A |
| 100 MHz | A | A | A | A | A | B | C | C | C | C | A | A | A | A | A | A | A |
| 200 MHz | A | A | A | A | A | A | A | C | C | C | C | B | A | A | A | A | A |
| 300 MHz | A | A | A | A | A | A | A | A | C | C | C | C | B | A | A | A | A |
| 400 MHz | B | B | C | C | B | B | B | B | B | B | B | C | C | C | B | B | B |
| 500 MHz | B | B | B | C | C | C | B | B | B | B | B | B | C | C | C | B | B |
| 600 MHz | B | C | B | B | B | C | C | C | B | B | B | B | B | C | C | C | B |
| 650 MHz | *2: Since discharge became intermittent, film formation evaluation was not carried out. ||||||||||||||||| |

TABLE 2

(Pressure condition 25 mTorr)

| Power source frequency | Photosensitivity measurement position — Upper side (high frequency introduction side) ← Center portion → Lower side |||||||||||||||||
|---|---|---|---|---|---|---|---|---|---|---|---|---|---|---|---|---|---|
| 13.56 MHz | *1: Since discharge was not generated, film formation evaluation was not carried out. ||||||||||||||||| |
| 30 MHz | B | B | C | C | C | B | B | B | B | B | B | B | B | B | B | B | B |
| 60 MHz | A | A | B | C | C | C | B | A | A | A | A | A | A | A | A | A | A |
| 100 MHz | A | A | A | A | B | B | C | C | C | C | B | A | A | A | A | A | A |
| 200 MHz | A | A | A | A | A | A | B | C | C | C | C | B | A | A | A | A | A |
| 300 MHz | A | A | A | A | A | A | A | B | C | C | C | C | B | A | A | A | A |
| 400 MHz | A | A | B | C | C | B | A | A | A | A | B | C | C | C | B | A | A |
| 500 MHz | A | A | B | B | C | C | B | A | A | A | A | A | C | C | C | A | A |
| 600 MHz | A | C | B | A | A | B | C | C | C | B | A | A | A | C | C | C | B | A |
| 650 MHz | *2: Since discharge became intermittent, film formation evaluation was not carried out. ||||||||||||||||| |

TABLE 3

(Pressure condition 5 mTorr)

| Power source frequency | Photosensitivity measurement position — Upper side (high frequency introduction side) ← Center portion → Lower side |||||||||||||||||
|---|---|---|---|---|---|---|---|---|---|---|---|---|---|---|---|---|---|
| 13.56 MHz | *1: Since discharge was not generated, film formation evaluation was not carried out. ||||||||||||||||| |
| 30 MHz | *1: Since discharge was not generated, film formation evaluation was not carried out. ||||||||||||||||| |
| 60 MHz | AA | AA | A | C | C | C | A | AA | AA | AA | AA | AA | AA | AA | AA | AA | AA |
| 100 MHz | AA | AA | A | B | C | C | C | C | B | A | AA | AA | AA | AA | AA | AA | AA |
| 200 MHz | AA | AA | AA | AA | AA | AA | B | C | C | C | A | AA | AA | AA | AA | AA | AA |
| 300 MHz | AA | AA | AA | AA | AA | AA | AA | A | B | C | C | C | B | AA | AA | AA | AA |
| 400 MHz | A | A | B | C | C | B | A | A | A | A | A | C | C | C | B | B | A | A |
| 500 MHz | A | A | B | B | C | C | B | A | A | A | A | A | C | C | C | B | A | A |
| 600 MHz | A | C | C | A | A | B | C | C | C | B | A | A | A | C | C | C | B | A |
| 650 MHz | *2: Since discharge became intermittent, film formation evaluation was not carried out. ||||||||||||||||| |

TABLE 4

(Pressure condition 50 mTorr)

| Power source frequency | Average deposition rate (nm/s) | Distribution of deposition rate (%) |
|---|---|---|
| 13.56 MHz | 0.15 | 10 |
| 30 MHz | 0.5 | 20 |
| 60 MHz | 1.1 | 21 |
| 100 MHz | 1.6 | 25 |
| 200 MHz | 1.8 | 28 |
| 300 MHz | 1.5 | 28 |
| 400 MHz | 0.8 | 35 |
| 500 MHz | 0.7 | 38 |
| 600 MHz | 0.6 | 40 |
| 650 MHz | *2: Since discharge became intermittent, film formation evaluation was not carried out. | |

TABLE 5

(Pressure condition 25 mTorr)

| Power source frequency | Average deposition rate (nm/s) | Distribution of deposition rate (%) |
|---|---|---|
| 13.56 MHz | *1: Since discharge was not generated, film formation evaluation was not carried out. | |
| 30 MHz | 0.4 | 21 |
| 60 MHz | 1.1 | 20 |
| 100 MHz | 1.7 | 22 |
| 200 MHz | 1.9 | 26 |
| 300 MHz | 1.4 | 26 |
| 400 MHz | 0.9 | 30 |
| 500 MHz | 0.7 | 34 |
| 600 MHz | 0.6 | 35 |
| 650 MHz | *2: Since discharge became intermittent, film formation evaluation was not carried out. | |

TABLE 6

(Pressure condition 5 mTorr)

| Power source frequency | Average deposition rate (nm/s) | Distribution of deposition rate (%) |
|---|---|---|
| 13.56 MHz | *1: Since discharge was not generated, film formation evaluation was not carried out. | |
| 30 MHz | *1: Since discharge was not generated, film formation evaluation was not carried out. | |
| 60 MHz | 1.0 | 20 |
| 100 MHz | 1.5 | 25 |
| 200 MHz | 1.7 | 28 |
| 300 MHz | 1.3 | 30 |
| 400 MHz | 0.6 | 38 |
| 500 MHz | 0.6 | 40 |
| 600 MHz | 0.5 | 44 |
| 650 MHz | *2: Since discharge became intermittent, film formation evaluation was not carried out. | |

TABLE 7

| | |
|---|---|
| High frequency power | 1 KW |
| $SiH_4$ | 500 sccm |
| Film formation pressure | 50 mTorr, 25 mTorr, 5 mTorr |
| Substrate temperature | 250° C. |

TABLE 8

(Pressure condition 50 mTorr)

| Power source frequency | Photosensitivity measurement position  Upper side (high frequency introduction side) ← Center portion → Lower side | | | | | | | | | | | | | | | |
|---|---|---|---|---|---|---|---|---|---|---|---|---|---|---|---|---|
| 30 MHz | B | A | B | A | A | B | B | B | A | B | B | A | B | A | A | A |
| 60 MHz | A | A | A | A | A | B | A | A | A | A | A | A | A | A | A | A |
| 100 MHz | A | A | A | A | A | A | A | A | A | A | A | A | A | A | A | A |
| 200 MHz | A | A | A | A | A | A | A | A | A | A | A | A | A | A | A | A |
| 300 MHz | A | A | A | A | A | A | A | A | A | A | A | A | A | A | A | A |
| 400 MHz | B | B | B | B | B | B | B | B | B | B | B | B | B | B | B | B |
| 500 MHz | B | B | B | B | B | B | B | B | B | B | B | B | B | B | B | B |
| 600 MHz | B | B | B | B | B | B | B | B | B | B | B | B | B | B | B | B |

TABLE 9

(Pressure condition 25 mTorr)

| Power source frequency | Photosensitivity measurement position  Upper side (high frequency introduction side) ← Center portion → Lower side | | | | | | | | | | | | | | | |
|---|---|---|---|---|---|---|---|---|---|---|---|---|---|---|---|---|
| 30 MHz | A | A | A | A | A | A | A | A | A | A | A | A | A | A | A | A |
| 60 MHz | A | A | A | A | A | A | A | A | A | A | A | A | A | A | A | A |
| 100 MHz | A | A | A | A | A | A | A | A | A | A | A | A | A | A | A | A |
| 200 MHz | A | A | A | A | A | A | A | A | A | A | A | A | A | A | A | A |

TABLE 9-continued (Pressure condition 25 mTorr)

Photosensitivity measurement position

| Power source frequency | Upper side (high frequency introduction side) | | | | | ← | Center portion | → | | | | | | | Lower side | | |
|---|---|---|---|---|---|---|---|---|---|---|---|---|---|---|---|---|---|
| 300 MHz | A | A | A | A | A | A | A | A | A | A | A | A | A | A | A | A | A |
| 400 MHz | A | A | A | A | A | A | A | A | A | A | A | A | A | A | A | A | A |
| 500 MHz | A | A | A | A | A | A | A | A | A | A | A | A | A | A | A | A | A |
| 600 MHz | A | A | A | A | A | A | A | A | A | A | A | A | A | A | A | A | A |

TABLE 10

(Pressure condition 5 mTorr)

Photosensitivity measurement position

| Power source frequency | Upper side (high frequency introduction side) | | | | | ← | Center portion | → | | | | | | | Lower side | | |
|---|---|---|---|---|---|---|---|---|---|---|---|---|---|---|---|---|---|
| 30 MHz | *1: Since discharge was not generated, film formation evaluation was not carried out. | | | | | | | | | | | | | | | | |
| 60 MHz | AA | AA | AA | AA | AA | AA | AA | AA | AA | AA | AA | AA | AA | AA | AA | AA | AA |
| 100 MHz | AA | AA | AA | AA | AA | AA | AA | AA | AA | AA | AA | AA | AA | AA | AA | AA | AA |
| 200 MHz | AA | AA | AA | AA | AA | AA | AA | AA | AA | AA | AA | AA | AA | AA | AA | AA | AA |
| 300 MHz | AA | AA | AA | AA | AA | AA | AA | AA | AA | AA | AA | AA | AA | AA | AA | AA | AA |
| 400 MHz | A | A | A | A | A | A | A | A | A | A | A | A | A | A | A | A | A |
| 500 MHz | A | A | A | A | A | A | A | A | A | A | A | A | A | A | A | A | A |
| 600 MHz | A | A | A | A | A | A | A | A | A | A | A | A | A | A | A | A | A |

TABLE 11

(Pressure condition 50 mTorr)

| Power source frequency | Average deposition rate (nm/s) | Distribution of deposition rate (%) |
|---|---|---|
| 30 MHz | 0.5 | 6 |
| 60 MHz | 1.0 | 6 |
| 100 MHz | 1.6 | 5 |
| 200 MHz | 1.8 | 5 |
| 300 MHz | 1.6 | 4 |
| 400 MHz | 0.7 | 6 |
| 500 MHz | 0.7 | 7 |
| 600 MHz | 0.6 | 8 |

TABLE 12

(Pressure condition 25 mTorr)

| Power source frequency | Average deposition rate (nm/s) | Distribution of deposition rate (%) |
|---|---|---|
| 30 MHz | 0.5 | 6 |
| 60 MHz | 0.9 | 5 |
| 100 MHz | 1.7 | 4 |
| 200 MHz | 2.0 | 4 |
| 300 MHz | 1.5 | 4 |
| 400 MHz | 0.7 | 6 |
| 500 MHz | 0.7 | 7 |
| 600 MHz | 0.6 | 7 |

TABLE 13

(Pressure condition 5 mTorr)

| Power source frequency | Average deposition rate (nm/s) | Distribution of deposition rate (%) |
|---|---|---|
| 30 MHz | *1 | *1 |
| 60 MHz | 0.8 | 4 |
| 100 MHz | 1.6 | 4 |
| 200 MHz | 1.7 | 4 |
| 300 MHz | 1.4 | 4 |
| 400 MHz | 0.7 | 6 |
| 500 MHz | 0.6 | 7 |
| 600 MHz | 0.5 | 7 |

*1: Since discharge was not generated, film formation evaluation was not carried.

TABLE 14

| | | |
|---|---|---|
| Surface protecting layer | $SiH_4$ | 100 sccm |
| | $H_2$ | 100 sccm |
| | $CH_4$ | 500 sccm |
| | Introducing power | 800 W |
| | Reaction pressure | 5 mTorr |
| | Film thickness | 1 μm |
| Photoconductive layer | $SiH_4$ | 400 sccm |
| | $H_2$ | 400 sccm |
| | Introducing power | 1000 W |
| | Reaction pressure | 5 mTorr |
| | Film thickness | 25 μm |
| Charge injection preventing layer | $SiH_4$ | 400 sccm |
| | $H_2$ | 400 sccm |
| | NO | 500 sccm |
| | $B_2H_6$ | 2000 ppm |
| | Introducing power | 800 W |
| | Reaction pressure | 5 mTorr |
| | Film thickness | 1 μm |

TABLE 15

| | |
|---|---|
| High frequency power | 800 W per cathode electrode |
| SiH$_4$ | 1500 sccm |
| Film formation pressure | 8 mTorr |
| Substrate temperature | 200° C. |

TABLE 16

| | | |
|---|---|---|
| Surface protecting layer | SiH$_4$ | 300 sccm |
| | H$_2$ | 300 sccm |
| | CH$_4$ | 1500 sccm |
| | Introducing power | 500 W per cathode electrode |
| | Reaction pressure | 5 mTorr |
| | Film thickness | 1 μm |
| Photoconductive layer | SiH$_4$ | 1500 sccm |
| | H$_2$ | 1500 sccm |
| | Introducing power | 800 W per cathode electrode |
| | Reaction pressure | 5 mTorr |
| | Film thickness | 25 μm |
| Charge injection preventing layer | SiH$_4$ | 1000 sccm |
| | H$_2$ | 1000 sccm |
| | NO | 1200 sccm |
| | B$_2$H$_6$ | 2000 ppm |
| | Introducing power | 500 W per cathode electrode |
| | Reaction pressure | 5 mTorr |
| | Film thickness | 1 μm |

TABLE 17

| | |
|---|---|
| High frequency power | 500 W per cathode electrode |
| SiH$_4$ | 400 sccm |
| Film formation pressure | 15 mTorr |
| Substrate temperature | 300° C. |

TABLE 18

| | |
|---|---|
| High frequency power | 2 KW |
| SiH$_4$ | 400 sccm |
| Film formation pressure | 15 mTorr |
| Substrate temperature | 300° C. |
| Power source frequency | 250 MHz |

TABLE 19

| | |
|---|---|
| High frequency power | 1 KW |
| SiH$_4$ | 500 sccm |
| Film formation pressure | 10 mTorr |
| Substrate temperature | 250° C. |

TABLE 20

(Pressure condition 50 mTorr)

| Power source frequency | Photosensitivity measurement position | | | | | | | | | | | | | | | | |
|---|---|---|---|---|---|---|---|---|---|---|---|---|---|---|---|---|---|
| | Upper side (high frequency introduction side) | | | | ← | Center portion | → | | | | | | | | | Lower side | |
| 30 MHz | B | A | B | A | A | B | B | B | A | B | B | A | B | B | A | A | A |
| 60 MHz | A | A | A | A | A | B | A | A | A | A | A | A | A | A | A | A | A |
| 100 MHz | A | A | A | A | A | A | A | A | A | A | A | A | A | A | A | A | A |
| 200 MHz | A | A | A | A | A | A | A | A | A | A | A | A | A | A | A | A | A |
| 300 MHz | A | A | A | A | A | A | A | A | A | A | A | A | A | A | A | A | A |
| 400 MHz | B | B | B | B | B | B | B | B | B | B | B | B | B | B | B | B | B |
| 500 MHz | B | B | B | B | B | B | B | B | B | B | B | B | B | B | B | B | B |
| 600 MHz | B | B | B | B | B | B | B | B | B | B | B | B | B | B | B | B | B |

TABLE 21

(Pressure condition 25 mTorr)

| Power source frequency | Photosensitivity measurement position | | | | | | | | | | | | | | | | |
|---|---|---|---|---|---|---|---|---|---|---|---|---|---|---|---|---|---|
| | Upper side (high frequency introduction side) | | | | ← | Center portion | → | | | | | | | | | Lower side | |
| 30 MHz | A | A | A | A | A | A | A | A | A | A | A | A | A | A | A | A | A |
| 60 MHz | A | A | A | A | A | A | A | A | A | A | A | A | A | A | A | A | A |
| 100 MHz | A | A | A | A | A | A | A | A | A | A | A | A | A | A | A | A | A |
| 200 MHz | A | A | A | A | A | A | A | A | A | A | A | A | A | A | A | A | A |
| 300 MHz | A | A | A | A | A | A | A | A | A | A | A | A | A | A | A | A | A |
| 400 MHz | A | A | A | A | A | A | A | A | A | A | A | A | A | A | A | A | A |
| 500 MHz | A | A | A | A | A | A | A | A | A | A | A | A | A | A | A | A | A |
| 600 MHz | A | A | A | A | A | A | A | A | A | A | A | A | A | A | A | A | A |

TABLE 22

(Pressure condition 5 mTorr)

Photosensitivity measurement position

| Power source frequency | Upper side (high frequency introduction side) | | | | | | | | ← Center portion → | | | | | | | | | Lower side |
|---|---|---|---|---|---|---|---|---|---|---|---|---|---|---|---|---|---|---|
| 30 MHz | *1: Since discharge was not generated, film formation evaluation was not carried out. | | | | | | | | | | | | | | | | | |
| 60 MHz | AA | AA | AA | AA | AA | AA | AA | AA | AA | AA | AA | AA | AA | AA | AA | AA | AA | AA |
| 100 MHz | AA | AA | AA | AA | AA | AA | AA | AA | AA | AA | AA | AA | AA | AA | AA | AA | AA | AA |
| 200 MHz | AA | AA | AA | AA | AA | AA | AA | AA | AA | AA | AA | AA | AA | AA | AA | AA | AA | AA |
| 300 MHz | AA | AA | AA | AA | AA | AA | AA | AA | AA | AA | AA | AA | AA | AA | AA | AA | AA | AA |
| 400 MHz | A | A | A | A | A | A | A | A | A | A | A | A | A | A | A | A | A | A |
| 500 MHz | A | A | A | A | A | A | A | A | A | A | A | A | A | A | A | A | A | A |
| 600 MHz | A | A | A | A | A | A | A | A | A | A | A | A | A | A | A | A | A | A |

TABLE 23

(Pressure condition 50 mTorr)

| Power source frequency | Average deposition rate (nm/s) | Distribution of deposition rate (%) |
|---|---|---|
| 30 MHz | 0.5 | 6 |
| 60 MHz | 1.0 | 6 |
| 100 MHz | 1.6 | 5 |
| 200 MHz | 1.8 | 5 |
| 300 MHz | 1.6 | 4 |
| 400 MHz | 0.7 | 6 |
| 500 MHz | 0.7 | 7 |
| 600 MHz | 0.6 | 8 |

TABLE 24

(Pressure condition 25 mTorr)

| Power source frequency | Average deposition rate (nm/s) | Distribution of deposition rate (%) |
|---|---|---|
| 30 MHz | 0.5 | 6 |
| 60 MHz | 0.9 | 5 |
| 100 MHz | 1.7 | 4 |
| 200 MHz | 2.0 | 4 |
| 300 MHz | 1.5 | 4 |
| 400 MHz | 0.7 | 6 |
| 500 MHz | 0.7 | 7 |
| 600 MHz | 0.6 | 7 |

TABLE 25

(Pressure condition 5 mTorr)

| Power source frequency | Average deposition rate (nm/s) | Distribution of deposition rate (%) |
|---|---|---|
| 30 MHz | *1 | |
| 60 MHz | 0.8 | 4 |
| 100 MHz | 1.6 | 4 |
| 200 MHz | 1.7 | 4 |
| 300 MHz | 1.4 | 4 |
| 400 MHz | 0.7 | 6 |
| 500 MHz | 0.6 | 7 |
| 600 MHz | 0.5 | 7 |

*1: Since discharge was not generated, film formation evaluation was not carried.

TABLE 26

| Layer | Gas/Parameter | Value | Unit |
|---|---|---|---|
| Surface protecting layer | $SiH_4$ | 100 | sccm |
| | $H_2$ | 100 | sccm |
| | $CH_4$ | 500 | sccm |
| | Introducing power | 800 | W |
| | Reaction pressure | 5 | mTorr |
| | Film thickness | 1 | μm |
| Photoconductive layer | $SiH_4$ | 400 | sccm |
| | $H_2$ | 400 | sccm |
| | Introducing power | 1000 | W |
| | Reaction pressure | 5 | mTorr |
| | Film thickness | 25 | μm |
| Charge injection preventing layer | $SiH_4$ | 400 | sccm |
| | $H_2$ | 400 | sccm |
| | NO | 500 | sccm |
| | $B_2H_6$ | 2000 | ppm |
| | Introducing power | 800 | W |
| | Reaction pressure | 5 | mTorr |
| | Film thickness | 1 | μm |

TABLE 27

| | |
|---|---|
| High frequency power | 800 W per cathode electrode |
| $SiH_4$ | 1500 sccm |
| Film formation pressure | 8 mTorr |
| Substrate temperature | 200° C. |

TABLE 28

| Layer | Gas/Parameter | Value |
|---|---|---|
| Surface protecting layer | $SiH_4$ | 300 sccm |
| | $H_2$ | 300 sccm |
| | $CH_4$ | 1500 sccm |
| | Introducing power | 500 W per cathode electrode |
| | Reaction pressure | 5 mTorr |
| | Film thickness | 1 μm |
| Photoconductive layer | $SiH_4$ | 1500 sccm |
| | $H_2$ | 1500 sccm |
| | Introducing power | 800 W per cathode electrode |
| | Reaction pressure | 5 mTorr |
| | Film thickness | 25 μm |
| Charge injection preventing layer | $SiH_4$ | 1000 sccm |
| | $H_2$ | 1000 sccm |
| | NO | 1200 sccm |
| | $B_2H_6$ | 2000 ppm |
| | Introducing power | 500 W per cathode electrode |
| | Reaction pressure | 5 mTorr |
| | Film thickness | 1 μm |

TABLE 29

| | |
|---|---|
| High frequency power | 500 W per cathode electrode |
| SiH$_4$ | 400 sccm |
| Film formation pressure | 15 mTorr |
| Substrate temperature | 300° C. |

TABLE 30

| | |
|---|---|
| High frequency power | 2.5 KW |
| SiH$_4$ | 400 sccm |
| Film formation pressure | 15 mTorr |
| Substrate temperature | 300° C. |
| Power source frequency | 250 MHz |

TABLE 31

| | |
|---|---|
| High frequency power | 1 KW |
| SiH$_4$ | 500 sccm |
| Film formation pressure | 10 mTorr |
| Substrate temperature | 250° C. |

What is claimed is:

1. A plasma processing apparatus comprising:
(a) a reaction vessel having a space whose pressure can be reduced;
(b) a substrate holdling means and a cathode electrode arranged on the reaction vessel; and
(c) a high frequency power source for supplying power to the cathode electrode; wherein the cathode electrode is provided with one or more mismatching portions along the cathode electrode length in which a characteristic impedance of a high frequency transmission line is changed in a traveling direction of an incident wave of a high frequency.

2. A plasma processing apparatus according to claim 1, wherein the cathode electrode comprises a conductive member and a dielectric member covering the conductive member.

3. A plasma processing apparatus according to claim 2, wherein the dielectric member comprises portions with different thicknesses.

4. A plasma processing apparatus according to claim 3, wherein the dielectric member comprises a portion having a small thickness at a side where the high frequency power is inputted.

5. A plasma processing apparatus according to claim 3, wherein the dielectric member comprises a portion having a small thickness at a central portion of the cathode electrode.

6. A plasma processing apparatus according to claim 2, wherein the dielectric member comprises portions having different dielectric constants.

7. A plasma processing apparatus according to claim 6, wherein the conductive member covered with the dielectric member comprises portions having different diameters.

8. A plasma processing apparatus according to claim 7, wherein the conductive member comprises a portion having a large diameter at a side where the high frequency power is inputted.

9. A plasma processing apparatus according to claim 6, wherein the dielectric member has a dielectric large constant at a side where the high frequency power is inputted.

10. A plasma processing apparatus according to claim 2, wherein the conductive member comprises portions having different diameters.

11. A plasma processing apparatus according to claim 10, wherein the conductive member comprises a portion having a large diameter at a side where the high frequency power is inputted.

12. A plasma processing apparatus according to claim 2, wherein the dielectric member comprises portions having different thicknesses, and the conductive member comprises portions having different diameters.

13. A plasma processing apparatus according to claim 12, wherein the dielectric member comprises a portion having a small thickness at a side where the high frequency power is inputted.

14. A plasma processing apparatus according to claim 12, wherein the conductive member comprises a portion having a large diameter at a side where the high frequency power is inputted.

15. A plasma processing apparatus according to claim 12, wherein the dielectric member comprises a portion having a small thickness at a side where the high frequency power is inputted, and the conductive member comprises a portion having a large diameter at a side where the high frequency power is inputted.

16. A plasma processing apparatus according to claim 8 wherein the dielectric member is provided with the mismatching portion which corresponds to a node of a standing wave of the high frequency inputted to the cathode electrode.

17. A plasma processing apparatus according to claim 16, wherein the mismatching portion includes a reflecting surface of the high frequency.

18. A plasma processing apparatus according to claim 17, wherein the mismatching portion comprises change in a diameter of the conductive member of the cathode electrode or change in a thickness of the dielectric member covering the conductive member.

19. A plasma processing apparatus according to claim 18, wherein the dielectric member comprises a portion having a gradually changed thickness.

20. A plasma processing apparatus according to claim 17, wherein the mismatching portion is provided in plural.

21. A plasma processing apparatus according to claim 1, wherein the substrate is a cylindrical substrate, the cylindrical substrate can be freely rotated, and a plurality of cylindrical substrates are arranged around the cathode electrode in the reaction vessel so that center axes of the plurality of cylindrical substrates is established on the substantially same circumference, and wherein plasma is generated between the cathode electrode and the plurality of cylindrical substrates, the plasma processing of a surface of the cylindrical substrate is carried out while the cylindrical substrate is rotated.

22. A plasma processing apparatus according to claim 1, wherein the substrate is a cylindrical substrate, a plurality of cathode electrodes are arranged around the cylindrical substrate, plasma is generated between the cathode electrode and the cylindrical substrates, and the plasma processing of a surface of the cylindrical substrate is carried out.

23. A plasma processing apparatus according to claim 22, wherein the cylindrical substrate can be freely rotated, and the plasma processing of the surface of the cylindrical substrate is carried out while the cylindrical substrate is rotated.

24. A plasma processing apparatus according to claim 1, wherein the substrate is a plane plate-shaped substrate; a single cathode electrode or a plurality of cathode electrodes is/are arranged parallel to the plane plate-shaped substrate; plasma is generated between the cathode electrode and the plane plate-shaped substrate; and the plasma processing of a surface of the plane plate-shaped substrate is carried out.

25. A plasma processing apparatus according to claim 1, wherein the substrate is a sheet-shaped substrate conveyed from a holding roll and wound up by a wind-up roll during film formation; a single cathode electrode or a plurality of cathode electrodes is/are arranged parallel to the sheet-shaped substrate; plasma is generated between the cathode electrode and the sheet-shaped substrate; and the plasma processing of a surface of the sheet-shaped substrate is carried out.

26. A plasma processing apparatus according to claim 1, wherein the frequency of the high frequency power is ranging from 30 to 600 MHz.

27. A plasma processing apparatus according to claim 1, wherein the frequency of the high frequency power is ranging from 60 to 300 MHz.

28. A plasma processing apparatus according to claim 1, wherein the cathode electrode is rod-shaped, and the cathode electrode is covered with a dielectric cover having a substantially nonuniform thickness in an axial direction of the cathode electrode.

29. A plasma processing method comprising:
   (a) introducing a gas into a reaction vessel having a space whose pressure can be reduced; and
   (b) applying a high frequency power having a mismatching portion along the cathode electrode length in which a characteristic impedance of a high frequency transmission line is changed in a traveling direction of an incident wave of a high frequency to a cathode electrode in the reaction vessel to generate plasma and to conduct plasma processing of a substrate held by a substrate holding means in said reaction vessel.

30. A plasma processing method according to claim 29, wherein the substrate is a cylindrical substrate; a plurality of cylindrical substrates are arranged around the cathode electrode, arranged in the reaction vessel, so that center axes of the plurality of cylindrical substrates are established on a same circumference; plasma is generated between the cathode electrode and the plurality of cylindrical substrates; and plasma processing of a surface of the cylindrical substrate is carried out while the cylindrical substrate is rotated.

31. A plasma processing method according to claim 29, wherein the substrate is a cylindrical substrate; a plurality of cathode electrodes are arranged around the cylindrical substrate; plasma is generated between the cathode electrode and the cylindrical substrate; and plasma processing of a surface of the cylindrical substrate is carried out.

32. A plasma processing method according to claim 31, wherein the plasma processing of the surface of the cylindrical substrate is carried out while the cylindrical substrate is rotated.

33. A plasma processing method according to claim 29, wherein the substrate is a plane plate-shaped substrate; a single cathode electrode or a plurality of cathode electrodes is/are arranged parallel to the plane plate-shaped substrate; plasma is generated between the cathode electrode and the plane plate-shaped substrate; and the plasma processing of a surface of the plane plate-shaped substrate is carried out.

34. A plasma processing method according to claim 29, wherein the substrate is a sheet-shaped substrate conveyed from a holding roll and wound up by a wind-up roll during film formation; a single cathode electrode or a plurality of cathode electrodes is/are arranged parallel to the sheet-shaped substrate; plasma is generated between the cathode electrode and the sheet-shaped substrate; and plasma processing of a surface of the sheet-shaped substrate is carried out.

35. A plasma processing method according to claim 29, wherein the frequency of the high frequency power applied to the cathode electrode is ranging from 60 to 300 MHz.

36. A plasma processing method according to claim 29, wherein the plasma processing includes formation of a deposited film.

37. A plasma processing method according to claim 36, wherein the deposited film comprises an amorphous material comprising at least one element of Group IV elements of the Periodic Table.

38. A plasma processing method according to claim 37, wherein the at least one element of Group IV elements is silicon.

39. A plasma processing method according to claim 36, wherein the deposited film is used for an electrophotographic photosensitive member.

40. A plasma processing method according to claim 29, wherein the plasma processing includes etching processing.

41. A plasma processing method according to claim 29, wherein the plasma processing includes ashing processing.

42. A cathode electrode comprising:
   (a) a center conductive member; and
   (b) a dielectric member, covering the conductive member, and further providing a mismatching portion in which an impedance with respect to the high frequency inputted front one end side of the conductive member is changed.

43. A cathode according to claim 42, comprising more than one mismatching portion.

44. A cathode electrode according to claim 42, wherein the mismatching portion comprises a portion in which a diameter of the center conductive member is changed or a thickness of the dielectric member is changed.

45. A cathode electrode according to claim 42, wherein the mismatching portion comprises a portion in which dielectric members having different dielectric constants are contacted.

* * * * *

UNITED STATES PATENT AND TRADEMARK OFFICE
CERTIFICATE OF CORRECTION

PATENT NO.   : 6,076,481

DATED        : June 20, 2000

INVENTOR(S)  : ATSUSHI YAMAGAMI ET AL.            Page 1 of 5

It is certified that error appears in the above-identified patent and that said Letters Patent is hereby corrected as shown below:

COLUMN 2:

Line 41, "is" (second occurrence) should be deleted.

COLUMN 3:

Line 53, "energy" should read --energy,--; and
    Line 54, "is used," should be deleted.

COLUMN 4:

Line 2, "a" should be deleted;
    Line 15, "an" should read --a--; and
    Line 25, "an" should read --a--.

COLUMN 5:

Line 30, "finding" should read --findings--.

COLUMN 6:

Line 15, "scam" should read --sccm--; and
    Line 48, "an" should read --a--.

COLUMN 8:

Line 5, "As the" should read --The--; and
            "experiment, the following was" should read --experiment--;

UNITED STATES PATENT AND TRADEMARK OFFICE
CERTIFICATE OF CORRECTION

PATENT NO.   : 6,076,481

DATED        : June 20, 2000

INVENTOR(S)  : ATSUSHI YAMAGAMI ET AL.

It is certified that error appears in the above-identified patent and that said Letters Patent is hereby corrected as shown below:

COLUMN 8: (cont.)

Line 6, "revealed." should read --revealed the following.--;
    Line 19, "an" should read --a--;
    Line 27, "were" should be deleted;
    Line 48, "is interfered" should read --interferes; and
    Line 63, "is easy to occur" should read --easily occurs--.

COLUMN 9:

Line 6, "an" should read --a--.

COLUMN 11:

Line 41, "is communicated" should read --communicates--.

COLUMN 12:

Line 9, "to the" should read --that--;
    Line 43, "an" should read --a--;
    Line 49, "are" should be deleted; and
    Line 56, "an" should read --a--.

COLUMN 13:

Line 7, "as a" should be deleted;
    Line 8, "preferable," should read --preferably--; and

UNITED STATES PATENT AND TRADEMARK OFFICE
CERTIFICATE OF CORRECTION

PATENT NO.    : 6,076,481
DATED         : June 20, 2000
INVENTOR(S)   : ATSUSHI YAMAGAMI ET AL.              Page 3 of 5

It is certified that error appears in the above-identified patent and that said Letters Patent is hereby corrected as shown below:

COLUMN 13: (cont.)

Line 33, "an" should read --a--.

COLUMN 14:

Line 55, "were obtain" should read --obtained--.

COLUMN 15:

Line 2,  "substrate" should read --substrates--; and
Line 51, "alignment" should read --alignments--.

COLUMN 17:

Line 14, "for" should be deleted.

COLUMN 18:

Line 25, "Experimental 1." should read
         --Experiment 1.--.

COLUMN 22:

Line 22, "wa" should read --was--; and
Line 40, "center." should read --centers.--.

COLUMN 23:

Line 4, "an" should read --a--.

UNITED STATES PATENT AND TRADEMARK OFFICE
CERTIFICATE OF CORRECTION

PATENT NO. : 6,076,481

DATED : June 20, 2000

INVENTOR(S) : ATSUSHI YAMAGAMI ET AL.

It is certified that error appears in the above-identified patent and that said Letters Patent is hereby corrected as shown below:

COLUMN 24:

Line 2, "of" should be deleted.

COLUMN 28:

Line 47, "carried." should read --carried out.--.

COLUMN 31:

Line 66, "carried." should read --carried out.--.

COLUMN 33:

Line 30, "electrode;" should read --electrode,--.

COLUMN 34:

Line 19, "claim 8" should read --claim 2,--.

UNITED STATES PATENT AND TRADEMARK OFFICE
CERTIFICATE OF CORRECTION

PATENT NO.     : 6,076,481

DATED          : June 20, 2000

INVENTOR(S)    : ATSUSHI YAMAGAMI ET AL.

It is certified that error appears in the above-identified patent and that said Letters Patent is hereby corrected as shown below:

COLUMN 36:

Line 39, "front" should read --from--; and
Line 41, "cathode" should read --cathode electrode--.

Signed and Sealed this

Twenty-second Day of May, 2001

Attest:

NICHOLAS P. GODICI

Attesting Officer     Acting Director of the United States Patent and Trademark Office